United States Patent
Dewey et al.

(10) Patent No.: US 11,355,621 B2
(45) Date of Patent: Jun. 7, 2022

(54) NON-PLANAR SEMICONDUCTOR DEVICE INCLUDING A REPLACEMENT CHANNEL STRUCTURE

(71) Applicant: Intel Corporation, Santa Clara, CA (US)

(72) Inventors: Gilbert Dewey, Hillsboro, OR (US); Willy Rachmady, Beaverton, OR (US); Sean Ma, Portland, OR (US); Nicholas Minutillo, Beaverton, OR (US); Tahir Ghani, Portland, OR (US); Matthew V. Metz, Portland, OR (US); Cheng-Ying Huang, Hillsboro, OR (US); Anand S. Murthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 140 days.

(21) Appl. No.: 16/648,199

(22) PCT Filed: Jan. 12, 2018

(86) PCT No.: PCT/US2018/013660
§ 371 (c)(1),
(2) Date: Mar. 17, 2020

(87) PCT Pub. No.: WO2019/139626
PCT Pub. Date: Jul. 18, 2019

(65) Prior Publication Data
US 2020/0227539 A1    Jul. 16, 2020

(51) Int. Cl.
*H01L 21/02* (2006.01)
*H01L 29/16* (2006.01)
*H01L 29/66* (2006.01)
*H01L 29/205* (2006.01)
*H01L 29/78* (2006.01)

(52) U.S. Cl.
CPC ...... *H01L 29/66795* (2013.01); *H01L 29/205* (2013.01); *H01L 29/66522* (2013.01); *H01L 29/66545* (2013.01); *H01L 29/785* (2013.01)

(58) Field of Classification Search
None
See application file for complete search history.

(56) References Cited

U.S. PATENT DOCUMENTS

| 6,943,087 B1 | 9/2005 | Xiang et al. |
| 9,425,313 B1 | 8/2016 | Chen et al. |

(Continued)

FOREIGN PATENT DOCUMENTS

| WO | 2016209278 | 12/2016 |
| WO | 2017111846 | 6/2017 |

OTHER PUBLICATIONS

International Search Report and Written Opinion from PCT/US2018/013660 dated Oct. 12, 2018, 13 pgs.

(Continued)

*Primary Examiner* — Joseph C. Nicely
*Assistant Examiner* — Lamont B Koo
(74) *Attorney, Agent, or Firm* — Essential Patents Group, LLP

(57) ABSTRACT

Techniques and mechanisms for providing functionality of a non-planar device which includes a semiconductor body disposed on a dielectric layer and over an underlying subfin region. In an embodiment, the dielectric layer is disposed between, and adjoins each of, a first semiconductor material of the subfin region and a second semiconductor material of semiconductor body. The dielectric layer is an artefact of fabrication processing wherein an epitaxy of the semiconductor body is grown horizontally along a length of the subfin region. During such epitaxial growth, the dielectric layer prevents vertical growth of the second semiconductor (Continued)

material from the subfin region. Moreover, at least a portion of a dummy gate determines a shape of the semiconductor body. In another embodiment, formation of the semiconductor body is preceded by an etching to remove a section of a fin portion which is disposed over the subfin region.

24 Claims, 11 Drawing Sheets

(56) References Cited

U.S. PATENT DOCUMENTS

| | | |
|---|---|---|
| 9,812,575 B1 | 11/2017 | Reznicek et al. |
| 2012/0261754 A1 | 10/2012 | Cheng et al. |
| 2013/0099282 A1 | 4/2013 | Chen et al. |
| 2014/0167108 A1 | 6/2014 | Rachmady et al. |
| 2015/0162403 A1* | 6/2015 | Oxland .............. H01L 29/20 257/27 |
| 2016/0190238 A1 | 6/2016 | Cheng et al. |
| 2016/0379820 A1 | 12/2016 | Cheng et al. |
| 2017/0278968 A1* | 9/2017 | Lan ............ H01L 21/823807 |

OTHER PUBLICATIONS

International Preliminary Report on Patentability from PCT/US2018/013660 dated Jul. 23, 2020, 9 pgs.

Extended European Search Report from European Patent Application No. 18899642.5 dated Jul. 14, 2021, 7 pgs.

* cited by examiner

NON-PLANAR SEMICONDUCTOR DEVICE INCLUDING A REPLACEMENT CHANNEL STRUCTURE

CLAIM OF PRIORITY

This Application is a National Stage Entry of, and claims priority to, PCT Patent Application No. PCT/US2018/013660, filed on Jan. 12, 2018 and titled "NON-PLANAR SEMICONDUCTOR DEVICE INCLUDING A REPLACEMENT CHANNEL STRUCTURE", which is incorporated by reference in its entirety for all purposes.

BACKGROUND

Embodiments of the invention relate generally to non-planar semiconductor devices that include III-V semiconductor alloys. Methods of manufacturing such devices are also described.

A FinFET is a transistor built around a thin strip of semiconductor material (referred to as the "fin"). The transistor includes the standard field effect transistor (FET) nodes/components: a gate, a gate dielectric, a source region, and a drain region. During operation, a conductive channel of the device resides on the outer sides of the fin beneath the gate dielectric. Specifically, current runs along "sidewalls" of the fin as well as along the top side of the fin. Because the conductive channel essentially resides along the three different outer, planar regions of the fin, such a FinFET is typically referred to as a "tri-gate" FinFET. Other types of FinFETs exist (such as "double-gate" FinFETs in which the conductive channel principally resides only along both sidewalls of the fin and not along the top side of the fin).

Certain benefits, such as channel mobility for transistors, may be obtained by forming the device layers in semiconductor material other than silicon, such as germanium and III-V materials. Where a crystalline material such as silicon serves as a starting material, epitaxial growth techniques may be utilized to additively form a transistor channel including non-silicon materials on the substrate. Such processes can be challenging for a number of reasons, including but not limited to mismatch between the lattice constants and/or thermal properties of the substrate and the layers epitaxially grown thereon.

Aspect ratio trapping (ART) technology is sometimes used to form FinFETs. ART mitigates the effect of dislocations that propagate upwards at a particular angle. In typical ART, a trench is made with a high enough aspect ratio such that the defects, which extend along a width of a fin disposed in the trench, terminate on the sidewall of the trench. More specifically, ART includes trapping defects along the sidewall of a shallow trench isolation (STI) portion by making the height (H) of the trench larger than the width (W) of the trench.

As successive generations of integrated circuit technologies continue to scale, there is expected to be an increasing premium placed on techniques to prevent or otherwise mitigate the effect of dislocations on transistor performance.

BRIEF DESCRIPTION OF THE DRAWINGS

The various embodiments of the present invention are illustrated by way of example, and not by way of limitation, in the figures of the accompanying drawings and in which.

DETAILED DESCRIPTION

Figure 1A:
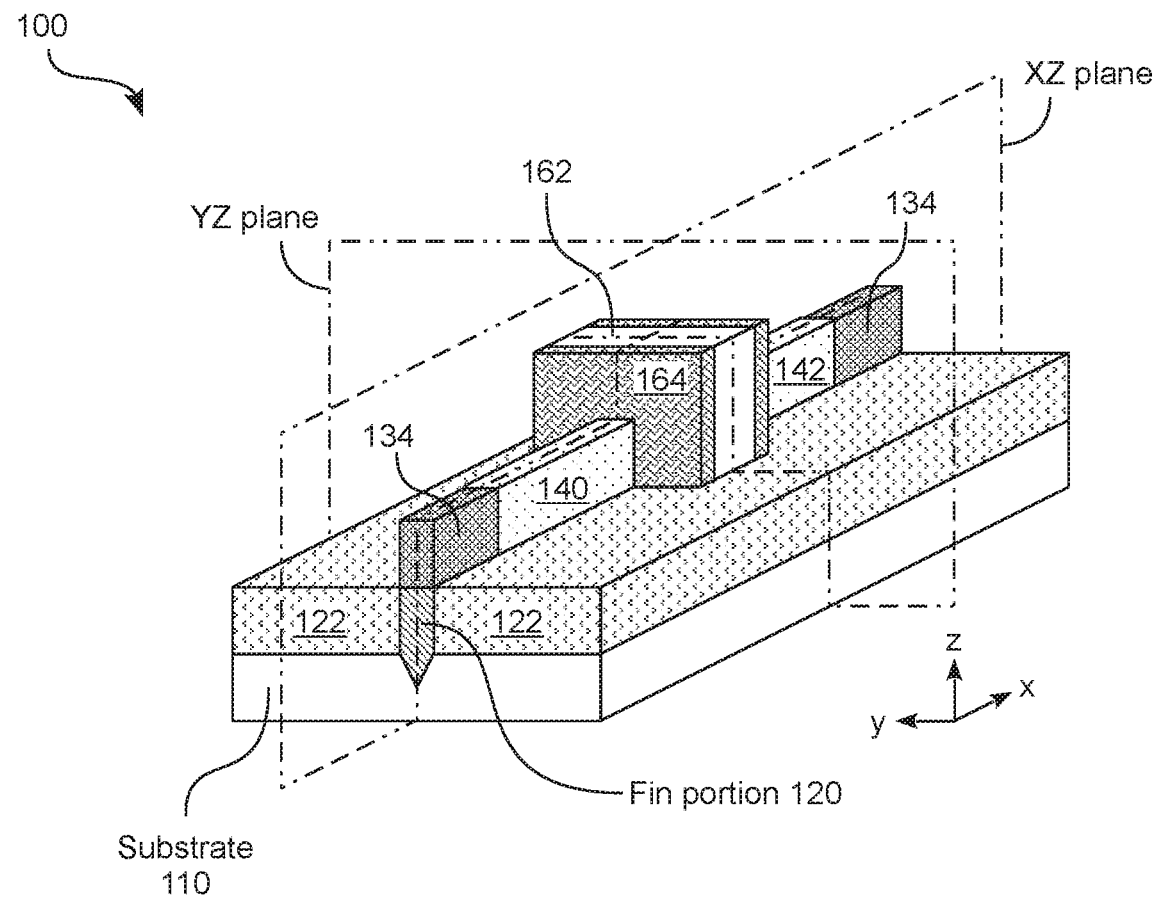
FIGS. 1A, 1B show various perspective and cross-sectional views of an integrated circuit according to an embodiment.
Figure 1A:
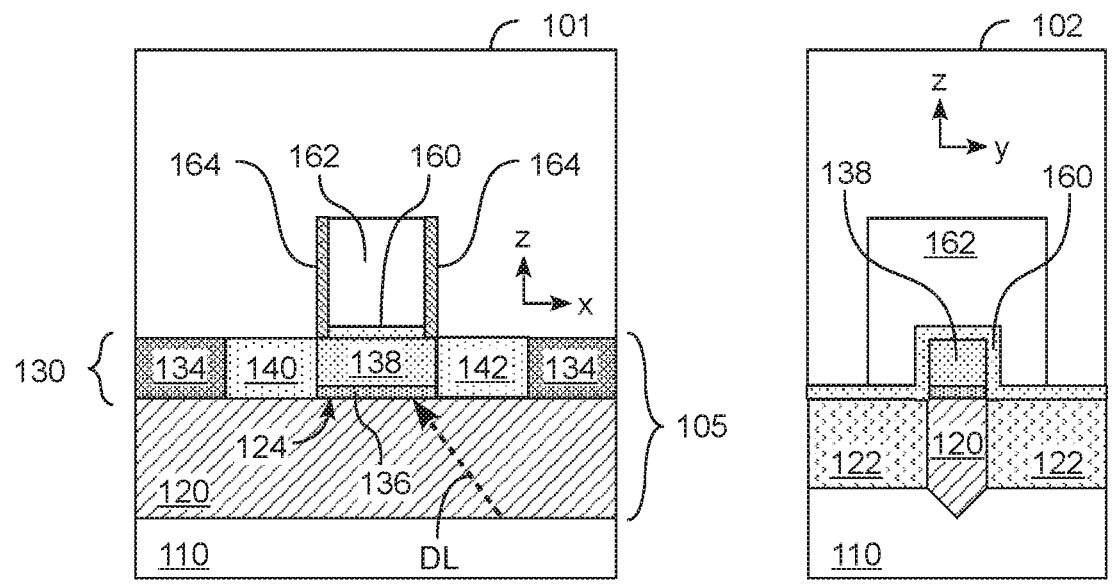

Embodiments described herein variously provide techniques and mechanisms for mitigating defects in a semiconductor structure of a non-planar device such as a transistor or a diode. In an embodiment, structures of the device are variously formed in or on an upper portion of a fin structure, wherein a lower portion of the fin structure comprises a semiconductor material which is different than a semiconductor material of the upper fin portion. An arrangement of the different semiconductor materials—e.g., including different III-V semiconductor materials—may facilitate high electron mobility characteristics while mitigating current leakage. As used herein, "III-V semiconductor material" refers to a semiconductor material which includes at least one Group III element and at least one Group V element. Different III-V semiconductor materials include different respective combinations each of one or more Group III elements and one or more Group V elements (e.g., including different respective elements and/or different respective ratios of the same elements). Unless otherwise indicated. "III-V material" also refers herein to a III-V semiconductor material.

As used herein, "source or drain structure" (or "SD structure") refers to a structure which is configured to function as one of a source of a device or a drain of the device. "Channel structure" refers herein to a structure of a device which, during operation of the device, may be used to selectively provide a conductive channel between two SD structures of the device. A non-planar device according to one embodiment may include an upper fin portion comprising a semiconductor body and source or drain structures on opposite respective ends of the semiconductor body. The semiconductor body may provide a channel structure which is operable to facilitate a conductive channel.

The non-planar device may include or adjoin one or more indicia of fabrication processing wherein the semiconductor body is grown laterally along a length of the upper fin portion—e.g., as opposed to being grown horizontally up from a surface of the lower fin portion. For example, a dielectric material may be disposed between (and may adjoin each of) a semiconductor material of the lower fin portion and a different semiconductor material of semiconductor body. By removing a section of an upper fin portion and laterally growing a semiconductor body in the place of that removed section, fabrication processing according to some embodiments may remove one or more dislocations which have not been otherwise avoided by aspect ratio trapping.

Certain features of various embodiments are described herein with respect to a circuit element (such as a transistor or a diode), wherein an upper portion of a fin structure, disposed on a lower portion of the fin structure, includes a channel structure of the device, and wherein a dielectric is disposed between, and adjoins each of, a first III-V material of the lower portion and a second III-V material of the channel structure. However, such description may be extended to apply to any of a variety of additional or alternative devices, wherein the upper fin portion includes a semiconductor body of the device, and wherein a dielectric is disposed between, and adjoins each of, a first semiconductor material of the lower fin portion and a second semiconductor material of the semiconductor body. It is noted that for the sake of illustration, the present disclosure focuses on example use cases in which a first semiconductor material is used to form a subfin region of a non-planar semiconductor device such as a FinFET, a multigate (e.g., double gate, tri-gate, etc.) transistor, a diode or the like. It should be understood that such discussion is for the sake of example only, and the technologies described herein may be extended to other use cases as may be appropriate and appreciated by one of ordinary skill in the art.

The technologies described herein may be implemented in one or more electronic devices. Non-limiting examples of electronic devices that may utilize the technologies described herein include any kind of mobile device and/or stationary device, such as cameras, cell phones, computer terminals, desktop computers, electronic readers, facsimile machines, kiosks, laptop computers, netbook computers, notebook computers, internet devices, payment terminals, personal digital assistants, media players and/or recorders, servers (e.g., blade server, rack mount server, combinations thereof, etc.), set-top boxes, smart phones, tablet personal computers, ultra-mobile personal computers, wired telephones, combinations thereof, and the like. More generally, the technologies described herein may be employed in any of a variety of electronic devices including integrated circuitry which comprises a non-planar semiconductor device.

FIG. 1A shows features of an integrated circuit (IC) device 100 including a non-planar semiconductor device according to an embodiment. Cross-sectional views 101, 102 in FIG. 1A also illustrate various features of IC device 100 in the XZ plane and YZ plane (respectively) of the xyz coordinate system shown. IC device 100 is one example of an embodiment wherein structures of a transistor, diode or other such device are variously disposed in or on a fin structure which comprises different respective III-V semiconductor materials. An upper portion of such a fin structure includes a semiconductor body (in this example embodiment, a channel structure) of the non-planar transistor, and a lower portion of the fin structure includes a III-V material which is different than a III-V material of the semiconductor body. Such an arrangement of different III-V materials may facilitate high electron mobility characteristics of the transistor, while also providing a large conduction band offset (CBO) to mitigate leakage current in the lower portion of the fin structure.

FIG. 1A shows one example of a portion of an IC device 100 consistent with the present disclosure, in this case a portion of a FinFET. As shown, IC device 100 includes a substrate 110, a trench dielectric 122 on substrate 110, and a fin structure 105 disposed in a trench which is formed by trench dielectric 122. Portions of fin structure 105 which are vertically offset from one another—e.g., including the illustrative fin portions 120, 130 shown—may comprise different respective III-V semiconductor materials. Fin portion 120 may be a "subfin region" of fin structure 105 insofar as fin portion 120 is disposed under fin portion 130, and some or all of fin portion 120 may not extend above trench dielectric 122.

Substrate 110 may be formed of any material that is suitable for use as a substrate of a semiconductor device, and in particular as a substrate for non-planar transistors such as FinFETS and multi-gate transistors. Non-limiting examples of suitable materials that may be used as substrate 110 therefore include silicon (Si), germanium (Ge), silicon-germanium (SiGe), silicon-carbide (SiC), sapphire, a III-V semiconductor, a silicon on insulate (SOI) substrate, combinations thereof, and the like. Without limitation, in some embodiments substrate 110 is formed from or includes single crystal silicon.

In some embodiments, one or more underlayers (not illustrated) may be deposited on substrate 110, e.g., such that they are present between substrate 110 and one or more of trench dielectric 122 and the materials forming fin portion 120. For example, one or more semiconductor base layers may be deposited on substrate 110. When used, such base layers may be pseudomorphic, metamorphic, or substantially lattice matched buffer and/or transition layers, as understood in the art. In any case, substrate 110 may be understood to provide an epitaxial seeding surface (e.g., a crystalline surface having a (100) or other suitable orientation) for the subsequent deposition of the materials of fin portion 120.

In the embodiment of IC device 100, a trench (not separately labeled) is defined by the sidewalls of trench dielectric 122 (hereinafter, trench sidewalls) and an upper portion of substrate 110. The dimensions of the trench may vary widely, and a trench of any suitable dimension may be used. Without limitation, in some embodiments the height (z-axis dimension) and width (y-axis dimension) of the trench enables the deposition of the materials used to form fin portion 120 via an aspect ratio trapping (ART) process. Accordingly, in some embodiments the width of the trench may be in a range of 1 nm to 500 nanometers (nm), such as in a range of 1 nm to 300 nm, in a range of 1 nm to 100 nm, in a range of 5 nm to 100 nm, or even in a range of 5 nm to 30 nm. Likewise, the height of the trenches may vary widely and may range, for example, from greater than 1 nm to 500 nm, such as 100 nm to 300 nm.

Trench dielectric 122 may be formed from any material that is suitable for use as a trench dielectric material of a non-planar semiconductor device. Non-limiting examples of such materials include oxides, nitrides and alloys, such as but not limited to silicon oxide ($SiO_2$), silicon nitride (SiN), combinations thereof, and the like. Without limitation, in some embodiments trench dielectric 122 is $SiO_2$. In more general terms, in some embodiments the non-planar semiconductor devices include a substrate and at least one trench that is formed on or within the substrate. The trench may be defined by at least two opposing sides (trench sidewalls) and a bottom. The bottom of the trench may be in the form of an upper surface of the substrate, and/or one or more buffer and/or transition layers deposited on the substrate.

A non-planar transistor of IC device 100 may comprise structures which are variously disposed in or on fin portion 130. For example, such a non-planar transistor may include a channel structure 138 and two source or drain ("SD") structures 140, 142 at opposite ends thereof—e.g., wherein fin portion 130 includes each of doped SD structures 140, 142 and channel structure 138. A gate structure of the non-planar transistor (e.g., including the illustrative gate dielectric 160 and gate electrode 162 shown) may extend over channel structure 138—e.g., wherein gate dielectric 160 provides electrical insulation between gate electrode 162 and each of a top of channel 138 and opposite vertical sidewalls of channel structure 138. In some embodiments, isolation spacers 164 may be disposed on opposite respective sidewalls of the gate structure. Although structures of IC device 100 are variously shown as having respective rectilinear geometries, some or all such structures—including structures of the non-planar geometries—may instead have curved, obliquely angled, tapered and/or otherwise non-rectilinear shapes.

By forming fin portion 120 and channel structure 138 with certain III-V semiconductor materials (also referred to herein as III-V material semiconductors), a relatively high CBO may be achieved between fin portion 120 and channel structure 138. By way of illustration and not limitation, side 124 of fin portion 120 is formed by a first III-V semiconductor material which is an alloy of gallium (Ga) and arsenic (As), or an alloy of indium (In) and phosphorus (P)—e.g., wherein the first III-V semiconductor material is an alloy of In, Al and As. In such an embodiment, at least a portion of channel structure 138 (e.g., a portion which adjoins a dielectric 136) may include a second III-V semiconductor material other than the first III-V semiconductor material—e.g., wherein the second III-V semiconductor material is an alloy of In and As, an alloy of Ga and As, or an alloy of In and P. For example, the second III-V semiconductor material may be an alloy of In and Ga and As. When an alloy of indium, gallium and arsenic (InGaAs) is selected for use as channel structure 138, a relatively high conduction band offset may be achieved by forming fin portion 120 from an alloy of indium, aluminum and arsenic (InAlAs) or an alloy of aluminum, arsenic and antimony (AlAsSb), either of which is substantially lattice matched with InAlAs.

In any case, fin portion 120 may include and/or be formed of one or more layers of a first III-V semiconductor material and channel structure 138 may include and/or be formed from one or more layers of a second III-V semiconductor material. Without limitation, in some embodiments the materials used to form the first and second III-V semiconductor materials are chosen such that the second semiconductor III-V semiconductor material may be hetero-epitaxially grown on the first III-V semiconductor material. The first and second III-V semiconductor materials may therefore be selected based at least in part on the relative differences between their respective lattice parameters. In some embodiments, the first and second III-V semiconductor materials may be substantially lattice matched—e.g., wherein any difference between their respective lattice parameters may be sufficiently low as to enable hetero-epitaxial growth of a layer of the second III-V semiconductor material on a layer of the first III-V semiconductor material. As used herein, the term "substantially lattice matched" means that the relative difference between corresponding lattice parameters of two III-V material semiconductors is supportive of epitaxial growth and does not substantially impact the properties of the heterojunction. In some embodiments, substantially lattice matched means that the relative difference between such lattice parameters is less than or equal to 5%, or even less than or equal to 1%. For example, in some embodiments the lattice parameters of at least one layer of fin portion 120 differ from at least one layer of channel structure 138 by less than or equal to 1%.

Alternatively or in addition to the foregoing, the first and second III-V semiconductor materials may be selected such that a relatively high conduction band offset (CBO) exists between fin portion 120 and channel structure 138. As used herein, "relatively high conduction band offset" means that the offset between the conduction bands of the first III-V semiconductor material of fin portion 120 and the second III-V semiconductor material of channel structure 138 is greater than or equal to a threshold conduction band offset. In some embodiments, the first and second III-V semiconductor materials are preferably selected such that the CBO between fin portion 120 and channel structure 138 is greater than or equal to a threshold CBO of 0.2 electron volts (eV), greater than or equal to a threshold CBO of 0.3 eV, or even greater than or equal to a threshold CBO of 0.4 eV. In some embodiments the first and second III-V semiconductor materials are selected such that the CBO between fin portion 120 and channel structure 138 is in a range of 0.3 eV to 0.8 eV—e.g., in a range of 0.3 eV to 0.7 eV.

In some embodiments the first and second III-V semiconductor materials may be selected such that material layers of such materials are substantially lattice matched, and a conduction band offset between such layers meets or exceeds a threshold conduction band offset. For example, in some embodiments the first and second III-V semiconductor material may be selected such that a layer of the second III-V semiconductor material is substantially lattice matched to an underlying layer of first III-V semiconductor material. As a result, the layer of the second III-V semiconductor material may be hetero-epitaxially grown on a layer of the first III-V semiconductor material. In such embodiments, the first and second III-V semiconductor materials may also be selected such that a conduction band offset between the layer of the second III-V semiconductor material and the underlying layer of the first III-V semiconductor material is within the CBO ranges stated above, or greater than or equal to the CBO values stated above.

Any of a wide variety of first and second III-V semiconductor materials that may be used, in various embodiments, to form one or more layers of fin portion 120 and channel structure 138, respectively. In some embodiments, the first III-V semiconductor material is a quaternary III-V semiconductor material, and the second III-V semiconductor material is a ternary or quaternary III-V semiconductor material. Without limitation, in some embodiments the first III-V semiconductor material is a quaternary alloy containing aluminum, and the second III-V semiconductor material is a ternary III-V semiconductor alloy.

As noted above quaternary III-V semiconductor materials are one example of a class of III-V semiconductor materials that may be used as a first III-V semiconductor material consistent with the present disclosure. Non-limiting examples of suitable quaternary III-V semiconductor material include but are not limited to quaternary III-V alloys containing aluminum. Examples of such alloys include quaternary alloys of some or all of indium (In), aluminum (Al), gallium (Ga), and arsenic ((As); e.g., InAlGaAs)), and alloys of some or all of aluminum, gallium, arsenic, and antimony ((Sb); e.g., AlGaAsSb)).

Without limitation, in some embodiments the first III-V semiconductor material used in fin portion 120 is a quaternary InAlGaAs alloy of the formula $Al_xGa_{0.48-x}In_{0.52}As_y$, wherein Al, Ga, and In occupy the group III sublattice of the alloy, As occupies the group V sublattice of the alloy, x is the mole fraction of aluminum in the group III sublattice, and y is the mole fraction of As in the group V sublattice. In such embodiments y may equal 1, and x may range from 0 to less than 0.48, and in some embodiments, may range from greater than or equal to 0.1 to less than or equal to 0.48, greater than or equal to 0.2 to less than or equal to 0.48, or even greater than or equal to 0.3 to less than or equal to 0.48. Without limitation, in some embodiments fin portion 120 is formed from one or more layers of a first III-V semiconductor material, wherein the first III-V semiconductor material is a quaternary $Al_xGa_{0.48-x}In_{0.52}As_y$ alloy in which y=1 and x ranges from greater than or equal to 0.3 to less than or equal to 0.48.

In other non-limiting embodiments, the first III-V semiconductor material used in fin portion 120 is a quaternary AlGaAsSb of the formula $Al_xGa_{1-x}As_ySb_{1-y}$, wherein Al and Ga occupy the group III sublattice of the alloy, As and Sb occupy the group V sublattice of the alloy, x is the mole fraction of aluminum in the group III sublattice, and y is the mole fraction of As in the group V sublattice. In such embodiments y may range from greater than 0 to less than or equal to 1, such as greater than 0 to less than or equal to 0.5, and x may range from greater than 0 to 0.5, such as greater than 0 to less than or equal to 0.48, 0.1 to less than or equal to 0.48, or even 0.2.

In some embodiment the first III-V semiconductor material(s) used in fin portion 120 may comprise a relatively small concentration of elements that are reactive to one or more elements in trench dielectric 122. For example, where trench dielectric includes oxygen (e.g., in instances where trench dielectric 122 is an oxide such as $SiO_2$), the composition of the first III-V semiconductor material(s) used in fin portion 120 may be tailored to contain relatively small concentration of elements that are reactive to oxygen. With regard to the quaternary alloys containing aluminum mentioned above, for example, the aluminum in such alloys may be highly reactive with oxygen in trench dielectric 122. As a result, when one or more layers of such materials are deposited within a trench bounded by trench dielectric 122, some portion of the aluminum in such alloys may react with oxygen in trench dielectric 122. Such reactions may introduce stress and or defects into fin portion 120, which as noted above may hinder heteroepitaxial growth of structures of fin portion 130 thereon.

Non-limiting examples of III-V semiconductor materials that may be used as second III-V semiconductor materials for forming one or more layers of channel structure 138 include binary, ternary, and quaternary III-V semiconductors such as InAs, InAsSb, InGaAs, InSb, AlGaAs, GaAs, InP, combinations thereof, and the like. Without limitation, in some embodiments channel structure 138 is formed from one or more layers of an InGaAs alloy, such as but not limited to an $In_{53}Ga_{47}As$ alloy, in which In and Ga are present in the group III sublattice, and As is present in the group V sublattice. Of course these III-V alloys are enumerated for example only, and it should be understood that any suitable III-V semiconductor may be used as a second III-V semiconductor material. In this regard, the present disclosure envisions embodiments wherein the second III-V semiconductor is any one of the possible binary, ternary, and quaternary combinations of Al, Ga, and IN with P, As, and Sb. Binary III-V semiconductors such as GaN may also be suitable candidates for use as the second III-V semiconductor.

With the foregoing in mind, it may be advantageous to control the amount of aluminum or other elements in the first III-V semiconductor materials described herein, so as to limit or avoid the introduction of stress and/or defects into fin portion 120 that may result from the interaction of such elements with components of trench dielectric 122. In this regard, in some embodiments the mole fraction of elements (e.g., Al) in the first III-V semiconductor materials described herein that are reactive with components (e.g., oxygen) of trench dielectric 122 may be limited to less than or equal to 0.5, such as less than 0.48, less than 0.4, from greater than 0 to 0.48, from greater than 0.05 to 0.48, or even from 0.1 to 0.48, relative to the total amount of elements in the alloy. As may be appreciated, the amount of aluminum in such materials is less than the amount of aluminum in the ternary InAlAs (mole fraction of Al on the group III sublattice>0.5), and AlAsSb (mole fraction of Al on the group III sublattice=1) alloys mentioned above.

In addition to controlling the amount of elements in the first III-V semiconductor materials described herein that are reactive to components of the trench dielectric, it may be advantageous to control the composition of a first III-V semiconductor material such that it provides an epitaxial seeding surface that is substantially lattice matched to one or more layers of a second III-V semiconductor material used in channel structure 138. With this in mind, Ga may be used to substitute at least a portion of Al in the group III sublattice, e.g., as is the case with the $Al_xGa_{0.48-x}In_{0.52}As_y$ and $Al_xGa_{1-x}As_ySb_{1-y}$ alloys noted above.

Consistent with the foregoing discussion, in some embodiments a combination of first and second III-V semiconductor materials may be selected for use in forming one or more layers of fin portion 120 and channel structure 138, e.g., to attain certain desired properties. With this in mind, in some embodiments fin portion 120 is formed from one or more layers of a first III-V semiconductor material, wherein the first III-V semiconductor material is a quaternary III-V semiconductor alloy such as InAlGaAs or AlGaAsSb, and channel structure 138 is formed from one or more layers of a second III-V semiconductor material, wherein the second III-V semiconductor material is a ternary III-V semiconductor material such as an In GaAs alloy.

In non-limiting embodiments, channel structure 138 is one or more layers of $In_{53}Ga_{47}As$, and fin portion 120 includes one or more layers of $Al_xGa_{0.48-x}In_{0.52}As_y$ or $Al_xGa_{1-x}As_ySb_{1-y}$, wherein x and y are as previously described in conjunction with such alloys. As will be described later, such combinations may allow the production of devices in which at least one layer of fin portion 120 is substantially lattice matched to at least one layer of channel structure 138, thereby enabling high quality hetero-epitaxial growth of one or more structures of fin portion 130 on fin portion 120. In addition, such combinations may enable the production of devices in which a relatively high conduction band offset exists between fin portion 120 and channel structure 138, thereby hindering or even preventing subfin leakage.

It is noted that FIG. 1A shows fin portion 120 as a single body of a first III-V semiconductor material, and further shows channel structure 138 as a single body of a second III-V semiconductor material that is disposed over fin portion 120. It should be understood that such configuration is for the sake of example only, and that other configurations are possible. Indeed, one or more of fin portion 120 and/or channel structure 138 are each be formed of multiple layers, e.g., of one or more first and second III-V semiconductor materials, respectively.

Regardless of the nature of the first and second III-V semiconductor materials, sub-portions of fin portion 130 may be processed to form SD structures 140, 142. For example, in some embodiments SD structures 140, 142 may be formed by doping a III-V material in such sub-portions with one or more P or N type dopants—e.g., using processing adapted from semiconductor fabrication techniques generally understood in the art.

Although some embodiments are not limited in this regard, fin portion 130 may further comprise one or more other structures (e.g. including the illustrative sub-portions 134 shown) other than any structure of the non-planar transistor. For example, one or both of the sub-portions 134 shown may each be disposed between the non-planar transistor and a respective other transistor (not shown) which is disposed on fin portion 120. Moreover, although fin portion 130 is shown as having a flat top side which is flush across SD structures 140, 142, channel structure 138 and sub-portions 134, some embodiments are not limited in this regard. Some or all of doped SD structures 140, 142 and sub-portions 134 may include a III-V semiconductor material which is the same as that of channel structure 138, although some embodiments are not limited in this regard.

Structures of IC device 100 may include one or more indicia of fabrication processing wherein channel structure 138 of the transistor is grown laterally, along a length (x-axis dimension) of fin structure 105, from an adjoining structure of fin portion 130. Such lateral growth may be constrained in one or more dimensions by at least a portion of a dummy gate (not shown) which, for example, is subsequently replaced with some or all of the gate structure of the transistor. For example, a dielectric 136 may be disposed between (and may adjoin each of) a III-V material of the fin portion 120 and another III-V material of channel structure 138. In such an embodiment, a portion of channel structure 138 may be disposed between respective portions of dielectric 136 and gate dielectric 160. Dielectric 136 may include SiN, $SiO_2$, SiON, $Al_2O_3$, $HfO_2$, $ZrO_2$, hafnium silicate ($HfSiO_x$), aluminum silicate ($AlSiO_x$) and/or any of various other suitable insulator materials which, for example, are adapted from conventional transistor insulation structures. In some embodiment, an average thickness (z-axis dimension) of dielectric 136 is in a range of 1 nanometer (nm) to 20 nm. Gate dielectric 160 may include an insulator such as that of dielectric 136 and/or a different dielectric material which, for example, is adapted from conventional gate dielectric structures.

Such a dielectric 136 may prevent vertical growth of channel structure 138 from a side 124 of the underlying III-V material of the fin portion 120. By removing a section of the fin portion 130 and laterally growing channel structure 138 in the place of that removed section, fabrication processing according to some embodiments may remove one or more dislocations which have not been avoided by aspect ratio trapping. By way of illustration and not limitation, a III-V material of fin portion 120 may have a dislocation (e.g., a stacking dislocation, a twinning dislocation or the like) which extends along a line of direction such as the illustrative line DL shown. To the extent that the line DL might be more closely aligned with the XZ plane than with the YZ plane, the dislocation is less likely to be prevented by aspect ratio trapping, and is more likely to extend to side 124 and contribute to a dislocation in fin portion 130. However, embodiments variously prevent such a dislocation in fin portion 130 by etching away a section thereof, and then subsequently performing a horizontal growth of a replacement channel structure 138 between SD structures 140, 142.

Figure 1B:
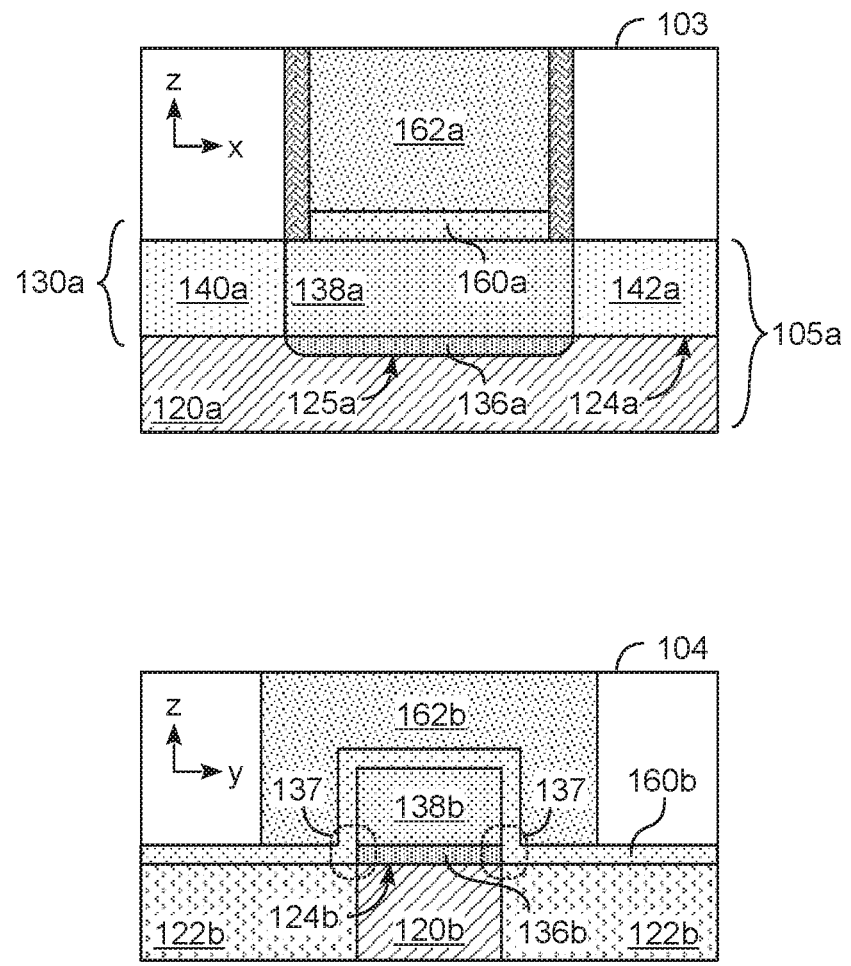

FIG. 1B shows examples of IC devices 103, 104—either of which may be IC device 100, in different embodiments—which are shown in cross-sectional views corresponding, for example, to the XZ plane and YZ plane (respectively) in FIG. 1A. IC devices 103, 104 may include respective indicia of a corresponding fabrication process to form a channel structure of a transistor by horizontally growing a III-V material over a different III-V material.

For example, IC device 103 includes a fin structure 105a comprising a lower portion 120a and an upper portion 130a (e.g., fin portion 120 and fin portion 130, respectively). Upper portion 130a includes SD structures 140a, 142a of a non-planar transistor and a channel structure 138a of the transistor. A gate structure of such a non-planar transistor may comprise a gate dielectric 160a and a gate electrode 162a, both of which variously extend in part around channel structure 138a. A dielectric 136a of IC device 103 may be disposed in a recessed region 125a which is formed by a side 124a of lower portion 120a. The recessed region 125a may be an artefact of an earlier etching process to remove a section of material (not shown) which previously was part of upper portion 130a. Subsequent to such etching, dielectric 136a may be selectively deposited—e.g., by atomic layer deposition (ALD)—on an exposed surface in recessed region 125a. Such deposition may be performed while at least part of a dummy gate structure adjoins a region where the removed section was located. For example, portions of the dummy gate structure may confine dielectric 136a along a y-axis (orthogonal to the XZ cross-sectional plane) to a region above lower portion 120a. After deposition of dielectric 136a, channel structure 138a may be formed by an epitaxial growth of a III-V semiconductor material in a horizontal direction from one or both of SD structures 140a. 142a. Such a III-V semiconductor material of channel structure 138a may be different than a III-V semiconductor material which forms side 124a. Dielectric 136a may prevent side 124a from being a site from which channel structure 138a is grown. In some embodiments, recessed region 125a extend to (or under) one or both of SD structures 140a, 140b.

In another embodiment, IC device 104 includes a fin structure 105b comprising a lower portion 120b and an upper portion which includes a channel structure 138b of a non-planar transistor and SD structures (not shown) of the non-planar transistor. Some or all of lower portion 120b may be disposed in a trench structure formed by a trench dielectric 122b. A gate structure of the non-planar transistor may comprise a gate dielectric 160b and a gate electrode 162b, both of which variously extend in part around channel structure 138a. A dielectric 136b of IC device 104 may be disposed on a side 124b of lower portion 120b—e.g., wherein dielectric 136b is an artifact of processing to grow channel structure 138a horizontally from one or more other structures of the upper portion (e.g., rather than vertically from side 124b). In interface between dielectric 136b and gate dielectric 160b—e.g., the interface in one or both of the illustrative regions 137 shown—may be defined by a difference between the respective chemical compositions of dielectric 136b and gate dielectric 160b by some other residual material between dielectric 136b and gate dielectric 160b and/or by a structural discontinuity across the interface (such as a difference between the respective structural characteristics of dielectric 136b and gate dielectric 160b).

Figure 2:
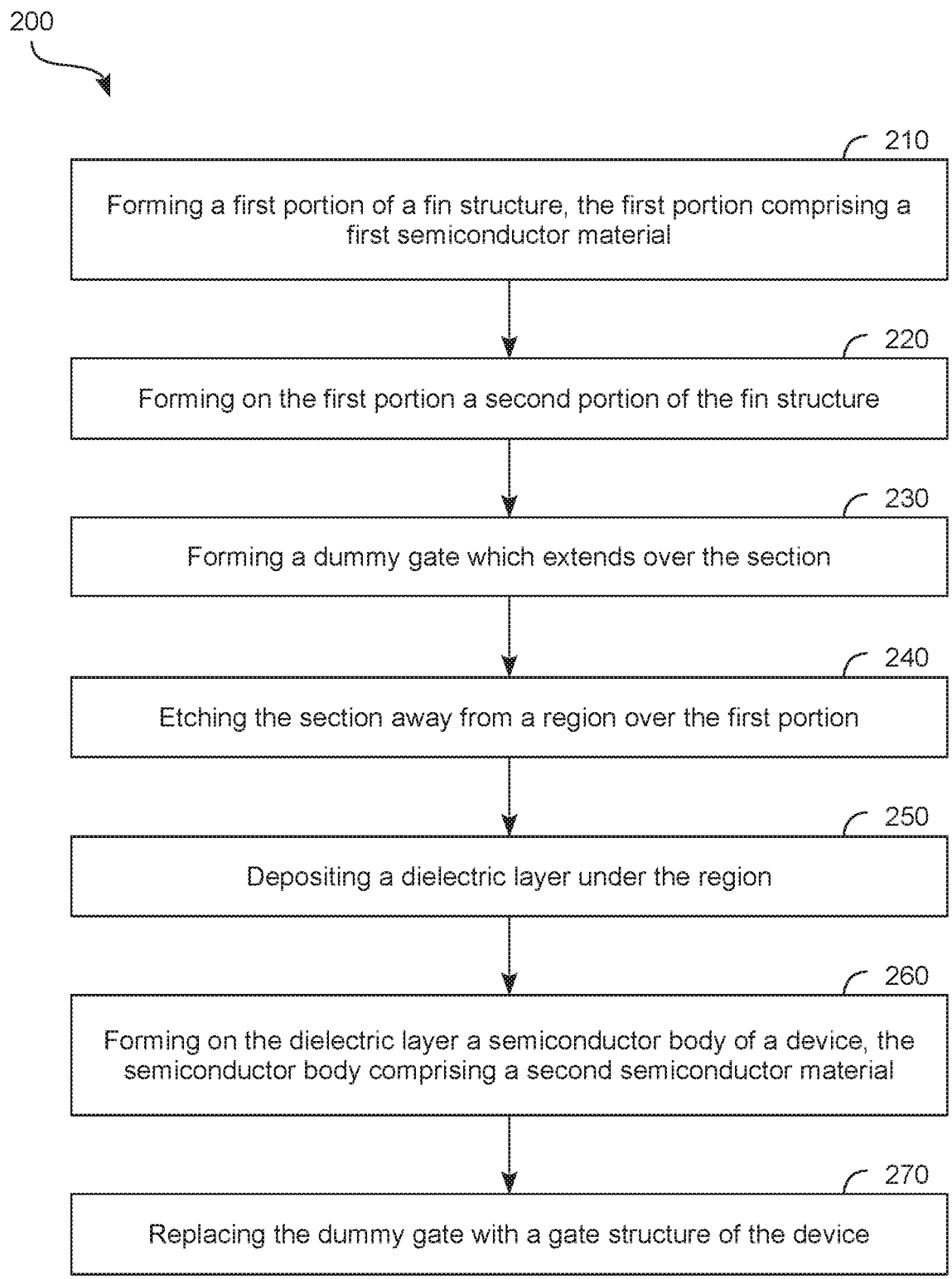
FIG. 2 is a flow diagram illustrating elements of a method to fabricate structures of a non-planar semiconductor device according to an embodiment.

FIG. 2 shows features of a method 200 to fabricate a non-planar device according to an embodiment. Method 200 may fabricate some or all of the structure of IC device 100, for example. To illustrate certain features of various embodiments, method 200 is described herein with reference to structures which are variously shown in FIGS. 3A, 3B. However, method 200 may additionally or alternatively fabricate any of a variety of other structures, in different embodiments.

As shown in FIG. 2, method 200 comprises (at 210) forming a first portion of a fin structure—the first portion comprising a first semiconductor material—and (at 220) forming on the first portion a second portion of the fin structure. In such an embodiment, method 200 may further comprise (at 230) forming a dummy gate which extends over the section.

Figure 3A:
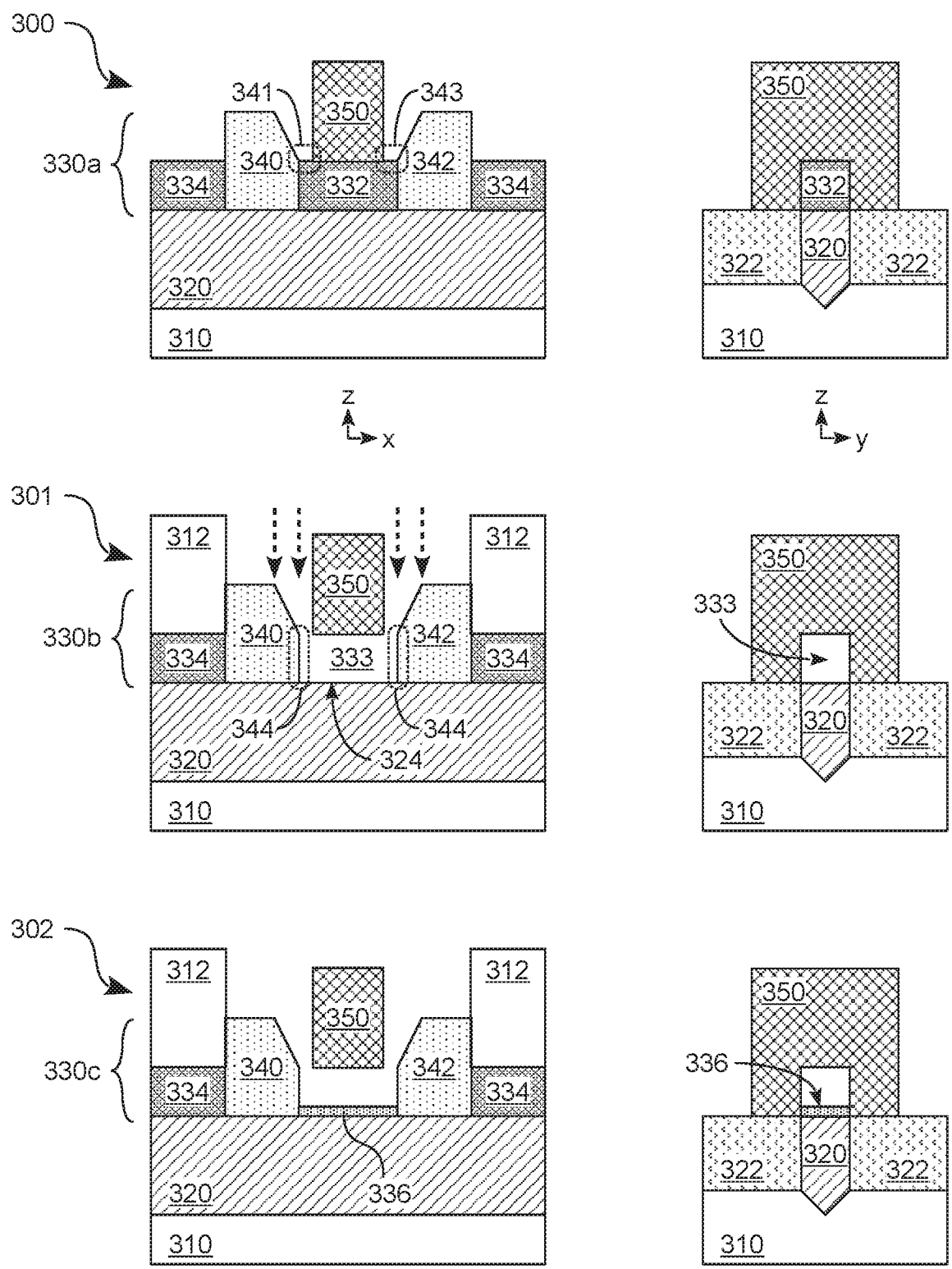
FIGS. 3A, 3B show cross-sectional views each of a respective stage of processing to fabricate structures of a non-planar semiconductor device according to an embodiment.
Figure 3B:
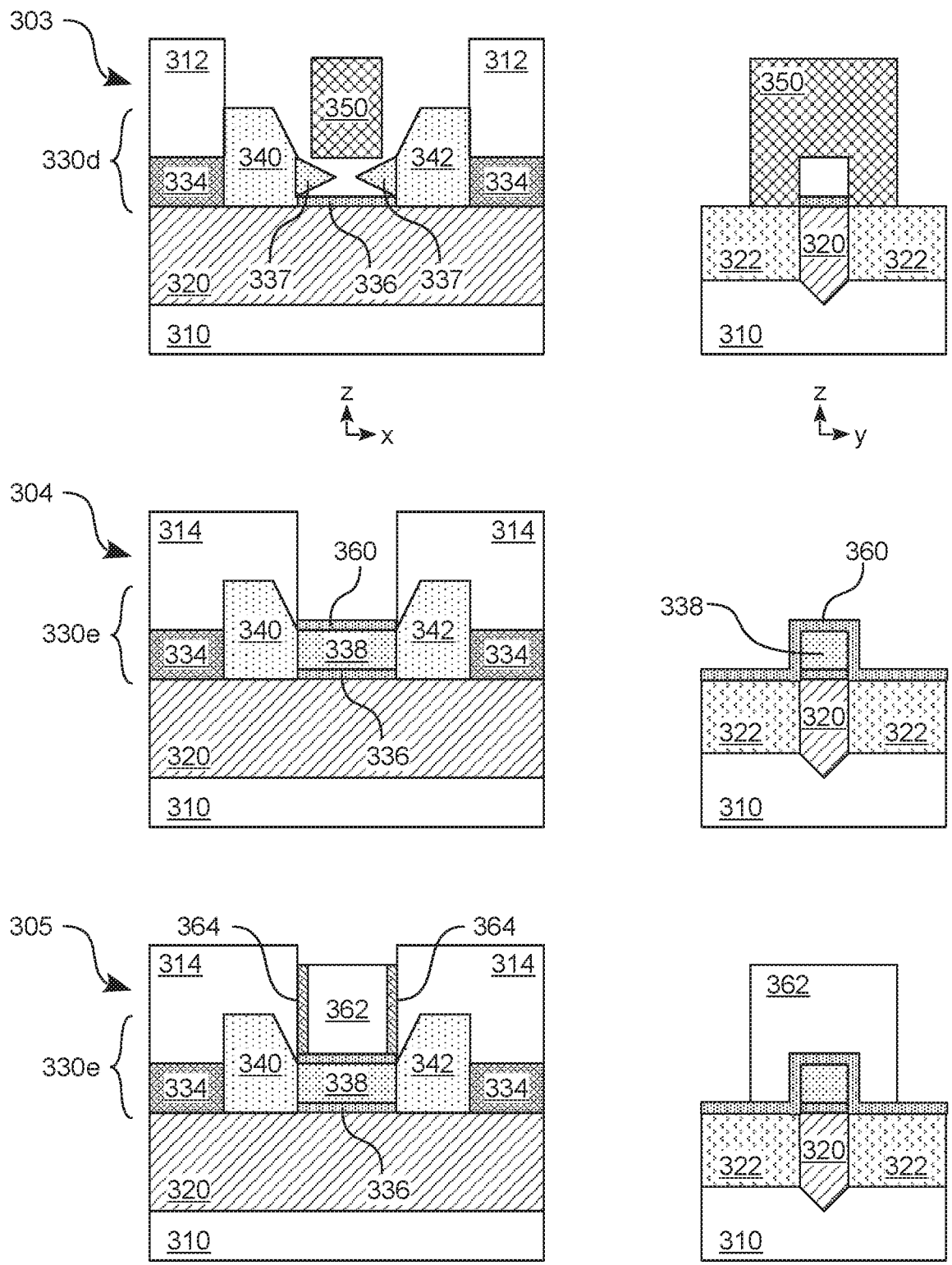

For example, referring now to FIGS. 3A, 3B, various respective cross-sectional views are shown for stages 300 through 305 of processing to fabricate transistor structures according to an embodiment. More particularly, for each of stages 300 through 305, corresponding structures during that stage are shown both in a respective XZ plane cross-sectional view and a respective YZ plane cross-sectional view. The processing represented by stages 300 through 305 may include operations of method 200—e.g., wherein such processing is to fabricate a device having at least some features of IC device 100.

At stage 300, a fin structure may be formed on a semiconductor substrate 310 (e.g., substrate 110), the fin structure including a fin portion 320 and a fin portion 330a disposed thereon. Fin portion 320 may extend from substrate 310 through a trench structure which is formed in a trench dielectric 322. A dummy gate 350 may be formed over at least a section 332 of fin portion 330a—e.g., wherein dummy gate 350 further extends along opposite sidewalls of section 332 and over trench dielectric 322. Trench dielectric 322 may be formed in any suitable manner. For example, trench dielectric 322 may be formed by depositing one or more layers of dielectric material (e.g., $SiO_2$) on substrate 310, e.g., via chemical vapor deposition (CVD), plasma enhanced CVD, or another suitable deposition process. The resulting deposited layer may be planarized, and an etching process may be used to remove portions of the dielectric material so as to form a trench. Of course this process is for the sake of example only, and other processes may be used to form a trench consistent with the present disclosure. For example, a trench may be formed by etching substrate 310 to form one or more fins, depositing trench dielectric 322 around the fin, and removing the portion of substrate 310 forming the fin so as to form a trench bounded by trench dielectric 322 and an upper surface of substrate 310. It should also be understood that the trench need not be formed on an upper surface of substrate 310. Indeed, a trench may be formed within substrate 310, e.g., via chemical etching or another suitable trench forming process. In such instances, one or more trench dielectric materials such as $SiO_2$, TiN, etc. may be selectively deposited within the trench. e.g., on the sidewalls thereof. One or more material layers of fin portion 320 may then be deposited within the trench.

The processing represented by stages 300 through 305 may replace section 332 with a channel structure of a non-planar transistor and, in some embodiments, may further replace dummy gate 350 with a gate structure of the non-planar transistor. To mitigate subfin current leakage, fin portion 320 may comprise a first semiconductor material—e.g., a first III-V material—which is to be different than a second semiconductor material of the eventually-formed channel structure (or other semiconductor body). In one embodiment, some or all of fin portion 330a may be formed by growing an amount of a second III-V semiconductor material on a first III-V semiconductor material of fin portion 320. Subsequently, one or more portions of the grown second III-V semiconductor material may be variously doped, etched or otherwise processed to form one or more structures of the non-planar transistor.

For example, at stage 300, fin portion 330a may comprise doped SD structures 340, 342 which adjoin opposite respective ends of section 332. The particular shapes and sizes of SD structures 340, 342 are merely illustrative, and may be different in other embodiments according to implementation-specific details. In some embodiments, doping and/or other processes to form one or both of SD structures 340, 342 may instead take place subsequent to stage 300. Although some embodiments are not limited in this regard, fin portion 330a may further comprise one or more other sub-portions 334 other than any structure that is to be part of the non-planar transistor. Some or all of section 332, SD structures 340, 342 and sub-portions 334 may each comprise the second III-V semiconductor material.

Dummy gate 350 may be formed by a patterned deposition of silicon nitride SiN and/or any of a variety of other suitable materials—e.g., wherein such deposition is adapted from conventional techniques for forming a dummy gate.

Referring again to FIG. 2, method 200 may further comprise (at 240) etching the section away from a region over the first portion. By way of illustration and not limitation, a configuration of dummy gate 350 relative to fin portion 330a may facilitate an epi undercut (EUC) process whereby section 332 is etched away from under a portion of dummy gate 350. For example, dummy gate 350 may be horizontally offset from one or both of SD structures 340, 342, resulting in one or more gap regions (such as the illustrative gap regions 341, 343 shown) which leave section 332 exposed to a subsequent wet etch or other subtractive process.

For example, at stage 301, a modified fin portion 330b may be formed from fin portion 330a by a wet etch which is performed through one of both of gap regions 341, 343 (e.g., using the illustrative patterned mask 412 shown). Such etching may expose a side 324 of fin portion 320 by removing some or all of section 332 from a region 333 under an adjoining portion of dummy gate 350. Such etching may further expose surfaces 344 of SD structures 340, 342, where one or both of surfaces 344 are each to provide a respective site from which an epitaxy is to be horizontally grown.

An etchant used at stage 301 may preferentially etch a III-V semiconductor material or other material of section 332—e.g., wherein an adjoining III-V semiconductor material of fin portion 320 is relatively more resistant to the etchant. Tetramethylammonium hydroxide (TMAH) is one example of such an etchant, although any of a variety of other substances may be adapted—e.g., from conventional semiconductor fabrication techniques—to accommodate a particular combination of different respective III-V semiconductor materials of section 332 and fin portion 320.

Referring again to FIG. 2, method 200 further comprises (at 250) depositing a dielectric under the region. For example, at stage 302, a modified fin portion 330c may be formed from fin portion 330b by depositing a dielectric 336 on the portion of side 324 which extends along region 333 between SD structures 340, 342. Dielectric 336 may include any of a variety of high-K insulator materials which, for example, are used in conventional non-planar transistors—e.g., wherein dielectric 336 includes $SiO_2$ or another suitable oxide. Dielectric 336 may be formed by atomic layer deposition through one or both of gap regions 341, 343 (for example, using patterned mask 312). Subsequently, region 333 may be further masked off before extraneous portions of the dielectric material are removed—e.g., using an angled ion etch—from dummy gate 350 and/or other surfaces of fin portion 330b.

Method 200 may further comprise (at 260) forming on the dielectric a semiconductor body of a device, the semiconductor body including a section comprising a second semiconductor material other than the first semiconductor material. Forming the semiconductor body at 260 may comprise performing a first horizontal growth of an epitaxial material including the second semiconductor material, the first horizontal growth in a first direction from a first surface of the second portion. In such an embodiment, the semiconductor body may be formed at 260 by further performing, concurrent with the first horizontal growth, a second horizontal growth of the epitaxial material from a second surface of the second portion, the second horizontal growth in a second direction opposite the first direction. By way of illustration and not limitation, a first SD structure of the device may include the first exposed surface—e.g., wherein, after forming the semiconductor body at 260, method 200 further grows a second SD structure of the device at an newly-formed end of the semiconductor body.

Referring now to stage 303, a modified fin portion 330d may be formed by a horizontal growth of an epitaxial channel material 337 from surfaces 344 of SD structures 340, 342. For example, chemical vapor deposition (CVD) or other such deposition processing may be performed to introduce the second III-V semiconductor material into region 333 via one or both of gap regions 341, 343. Although some embodiments are not limited in this regard, the second III-V semiconductor material may be the same as a III-V material of one or both of SD structures 340, 342. The epitaxial channel material 337 may continue to grow into region 333 to form a contiguous semiconductor body extending between SD structures 340, 342.

For example, as shown at stage 304, a modified fin portion 330e may be formed from fin portion 330d by completing the formation of a channel structure 338 from the horizontal growth of epitaxial channel material 337. One or more sides of dummy gate 350 may limit or otherwise define at least in part a final shape of channel structure 338—e.g., wherein dummy gate 350 is subsequently etched, polished or otherwise removed. Additional structures of the non-planar transistor may be variously formed on channel structure 338. For example, a layer of a gate dielectric 360 may be selectively deposited on the channel structure 338—e.g., using the illustrative patterned mask 314 shown. Gate dielectric 360 may provide electrical insulation between channel structure 338 and a gate electrode and/or any other gate structures that are to be subsequently formed.

The first III-V material may comprise gallium (Ga) and arsenic (As) or may comprise may comprise indium (In) and phosphorus (P), for example. In some embodiments, the first III-V material comprises indium (In), aluminum (Al) and arsenic (As). Alternatively or in addition, the second III-V material may comprise arsenic (As) and one of indium (In) or gallium (Ga)—e.g., wherein the second III-V material comprises indium (In), Ga and As. By way of illustration and not limitation, the second III-V material may comprise $In_xGa_{1-x}As_y$, wherein x is a mole fraction of In and y is a mole fraction of As. However, any of a variety of other combinations of different respective III-V materials may be provided by the first fin portion and the channel structure, in other embodiments.

Referring again to FIG. 2, method 200 may further comprises (at 270) replacing the dummy gate with a gate structure of the device. For example, as shown at stage 305, one or more conductor materials and/or one or more semiconductor materials of a gate structure 362 may be selectively deposited on gate dielectric 360—e.g., using patterned mask 314. Gate structure 362 may include a gate electrode and, in some embodiments, a work function material and/or one or more other layers of a gate stack. In some embodiments, isolation spacers 364 are further formed on opposite sidewalls of gate structure 362. In one such embodiment, one or both of SD structures 340, 342 may be doped only after formation of isolation spacers 364.

Figure 4A:
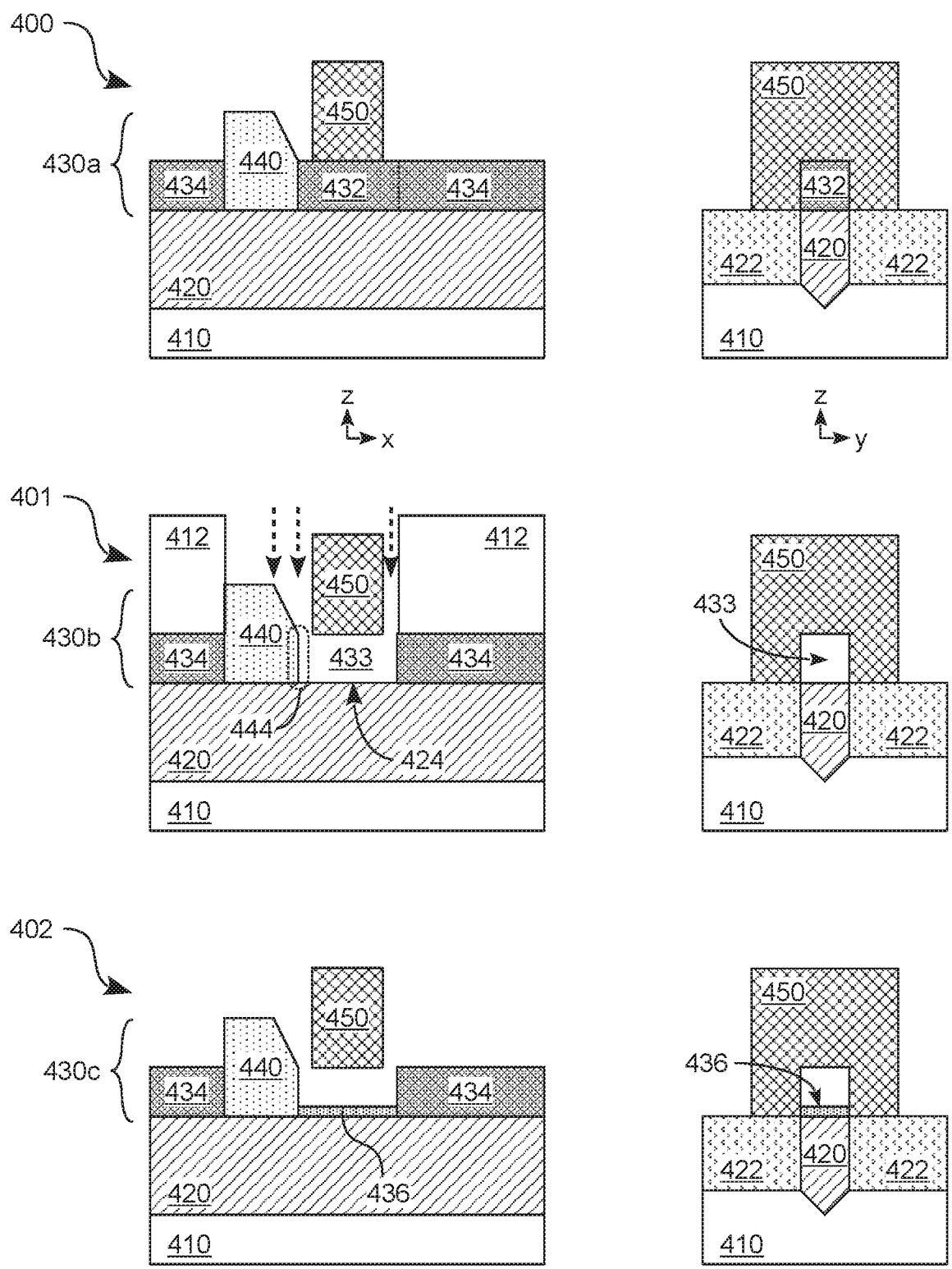
FIGS. 4A, 4B show cross-sectional views each of a respective stage of processing to fabricate structures of a non-planar semiconductor device according to an embodiment.
Figure 4B:
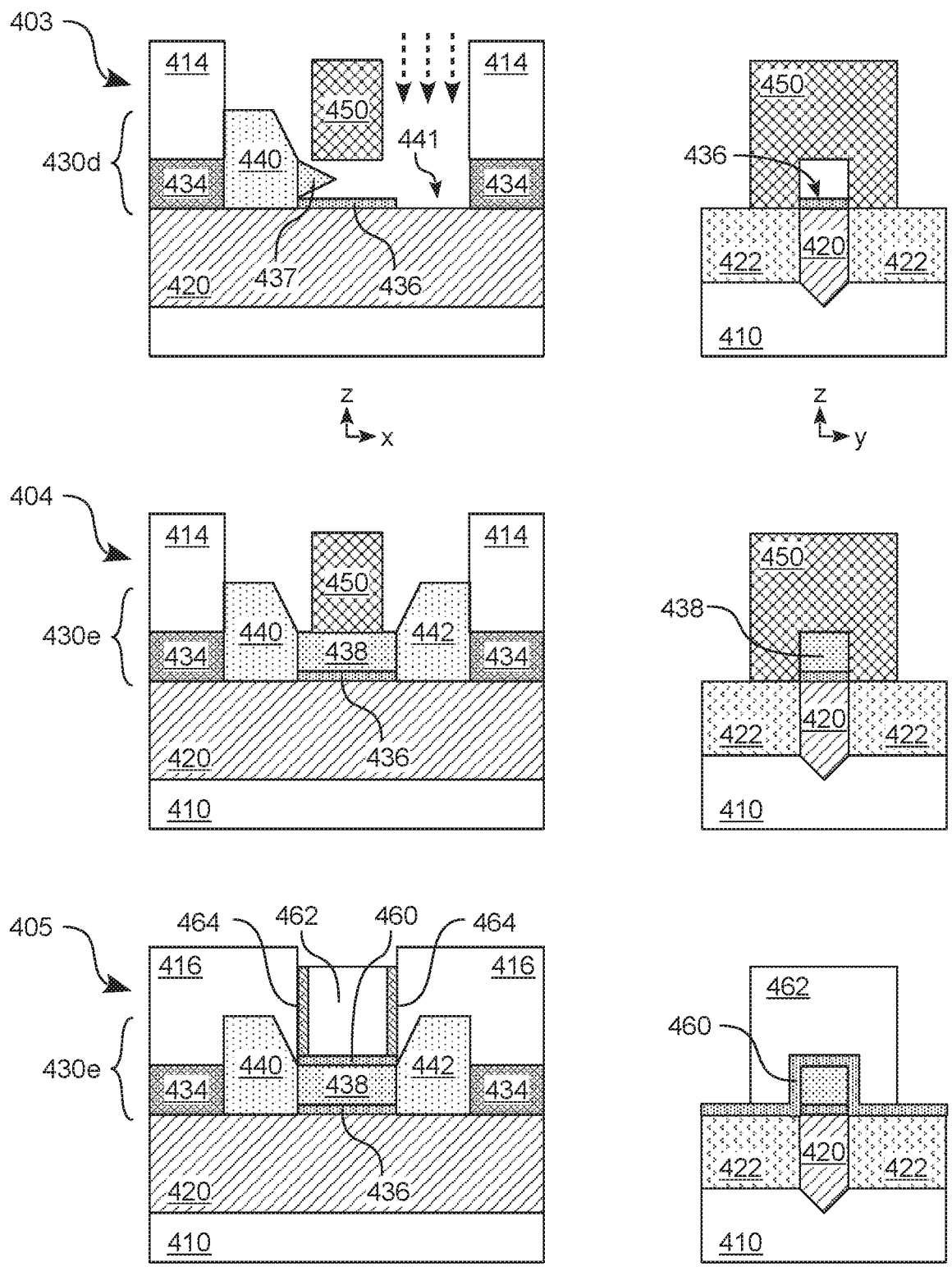

Referring now to FIGS. 4A, 4B, various cross-sectional views are shown each for a respective one of stages 400 through 405 of processing to fabricate transistor structures according to another embodiment. The processing represented by stages 400 through 405 may include operations of method 200—e.g., wherein such processing is to fabricate a device having at least some features of IC device 100.

At stage 400, a fin structure may be formed on a semiconductor substrate 410—e.g., the fin structure including vertically offset fin portions 420, 430a. Fin portion 420 may extend through a trench structure which is formed in a trench dielectric 422 on substrate 410, and a dummy gate 450 may be formed over a section 432 of fin portion 430a. Fin portion 420 may comprise a first III-V semiconductor material different than a second III-V semiconductor material of a channel structure which is to be formed by the processing shown in stages 400 through 405. For example, some or all of fin portion 430a may be formed by growing an amount of the second III-V semiconductor material on the first III-V semiconductor material of fin portion 420. Subsequently, one or more portions of the grown second III-V semiconductor material may be variously doped, etched or otherwise processed to form one or more structures of a non-planar transistor.

During stage 400, fin portion 430a may comprise a doped SD structure 440 which adjoins one end of section 432. The particular shape and size of SD structure 440 are merely illustrative, and may be different in other embodiments according to implementation-specific details. In some embodiments, doping and/or other processes to form SD structure 440 from fin portion 430a may instead take place subsequent to stage 400. Although some embodiments are not limited in this regard, fin portion 430a may further comprise one or more other sub-portions 434—e.g., other than any structure that is to be part of the non-planar transistor. Some or all of section 432, SD structure 440 and sub-portions 434 may each comprise the second III-V semiconductor material. A configuration of dummy gate 450 relative to fin portion 430a may facilitate an EUC process whereby section 432 is etched away from under a portion of dummy gate 450. For example, dummy gate 450 may be horizontally offset from SD structure 440, resulting in at least one gap region which leaves section 432 exposed to subsequent subtractive processing.

For example, at stage 401, a modified fin portion 430b may be formed from fin portion 430a by a wet etch (e.g., using the illustrative patterned mask 412 shown) of section 432 through one or more gap regions at a bottom side of dummy gate 450. Such etching may form or otherwise expose a side 424 of fin portion 420 by removing some or all of section 432 from a region 433 under an adjoining portion of dummy gate 450. Such etching may further expose a surface 444 of SD structure 440 which provides a site from which an epitaxy is to be horizontally grown. The etching at stage 401 may preferentially remove a III-V semiconductor material or other material of section 432—e.g., wherein an adjoining III-V semiconductor material of fin portion 420 is relatively more resistant to such etching. TMAH or any of various other etchant materials may be used to accommodate the particular combination of different III-V semiconductor materials of section 432 and fin portion 420.

At stage 402, a modified fin portion 430c may be formed from fin portion 430b by selectively depositing a dielectric 436 on the exposed portion of side 424 which extends along region 433. The deposition and/or physical properties of dielectric 436 may, for example, be similar to that described herein with respect to dielectric 336—e.g., wherein region 433 is to be further masked before a subsequent angled ion etch to remove extraneous portions of the dielectric material from dummy gate 450 and/or other surfaces of fin portion 430b.

At stage 403, a modified fin portion 430d may be formed by etching (e.g., using the illustrative patterned mask 414 shown) to remove at least some part of one sub-portion 434 which adjoins dielectric 436. Such etching—e.g., using the etchant which removed section 432—may expose a region 441 of fin portion 420 on which another SD structure of the non-planar transistor is to be subsequently formed. After such etching to expose region 441, a horizontal growth of an epitaxial channel material 437 may be started at the exposed surface 444 of SD structure 440. For example, CVD or other such deposition processing may be performed to introduce the second III-V semiconductor material into region 433. Although some embodiments are not limited in this regard, the second III-V semiconductor material may be the same as a III-V material of SD structure 440.

The epitaxial channel material 437 may continue to grow into region 433 to form a contiguous channel structure which extends under (and past) an adjoining portion of dummy gate 450. For example, as shown at stage 404, a modified fin portion 430e may be formed from fin portion 430d by completing the formation of a channel structure 438 from the horizontal growth of epitaxial channel material 437. One or more sides of dummy gate 450 may limit or otherwise define at least in part a final shape of channel structure 438. The epitaxial growth process may be continued after formation of channel structure to further build up another SD structure 442 of the non-planar transistor. In such an embodiment, a dopant may be introduced or otherwise increased in concentration after channel structure 438 has been formed. Alternatively, doping of SD structure 442 may take place after the epitaxial growth processes of stage 404.

As shown at stage 405, dummy gate 450 may be subsequently etched, polished or otherwise removed—e.g., wherein one or more gate structures of the transistor are to replace dummy gate 450. For example, a layer of a gate dielectric 460 may be selectively deposited on the channel structure 438—e.g., using the illustrative patterned mask 416 shown. Furthermore, isolation spacers 464 may be formed on respective sidewalls of patterned mask 416, and one or more material layers of a gate electrode 462 (e.g., part of a gate stack) may be selectively deposited on gate dielectric 460. Gate dielectric 460 may provide electrical insulation between channel structure 438 and a gate electrode and/or other gate structures that are to be subsequently formed. Formation of gate dielectric 460, isolation spacers 464 and/or gate electrode 462 may be adapted from conventional techniques for fabricating a gate of a non-planar transistor.

Figure 5A:
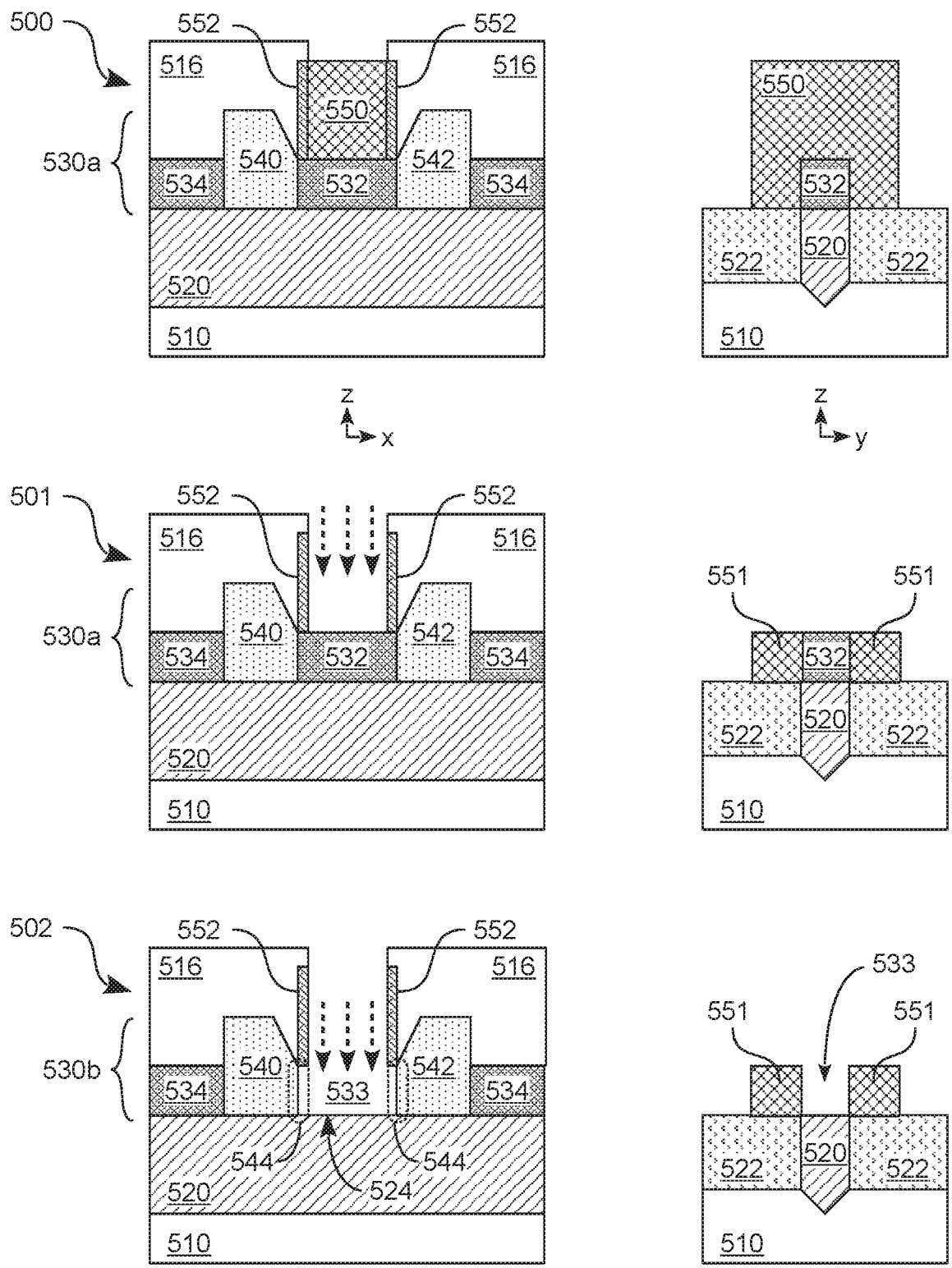
FIGS. 5A, 5B show cross-sectional views each of a respective stage of processing to fabricate structures of a non-planar semiconductor device according to an embodiment.
Figure 5B:
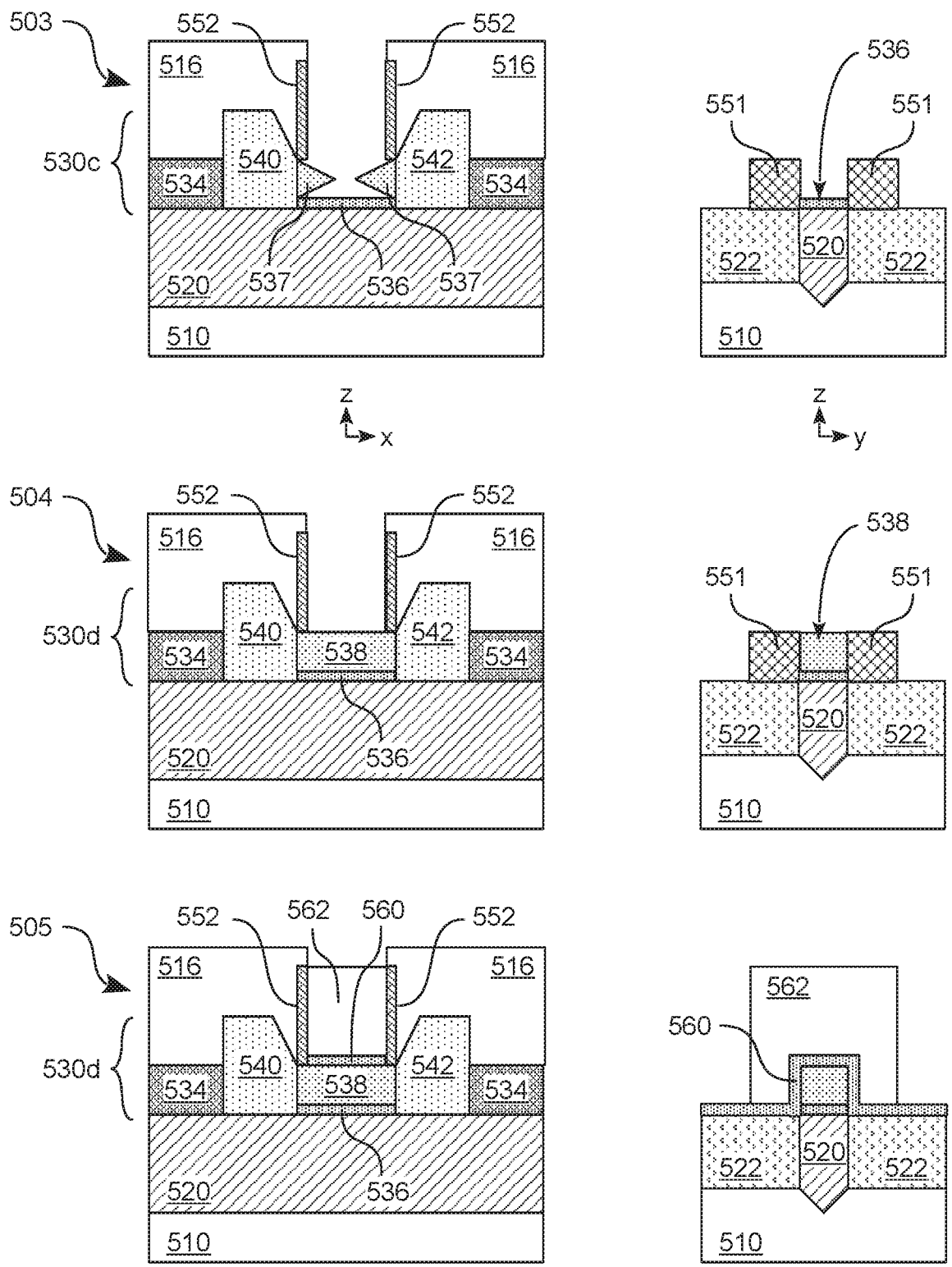

Referring now to FIGS. 5A, 5B, various cross-sectional views are shown each for a respective one of stages 500 through 505 of processing to fabricate transistor structures according to another embodiment. The processing represented by stages 500 through 505 may include operations of method 200—e.g., wherein such processing is to fabricate a device having at least some features of IC device 100.

In some embodiments, processing to form the structures shown at stage 500 include, for example, some or all of the processing to form structures such as those shown at stage 300. At stage 500, fin portions 520, 530a of a fin structure are formed on a semiconductor substrate 510, and a dummy gate 550 is formed over a section 532 of fin portion 530a. In one embodiment, a patterned mask 516 is used to form dummy gate 550 between two isolation spacers 552. Fin portion 520, which extends through a trench structure in a trench dielectric 522 on substrate 510, may include a first III-V semiconductor material different than a second III-V semiconductor material of a channel structure which is to be formed subsequent to stage 500. Fin portion 530a may comprise two source or drain structures (such as the illustrative doped SD structures 540, 542 shown) which adjoin opposite respective ends of section 532. In other embodiments, one or both of SD structures 540, 542 may be doped only after stage 500. Although some embodiments are not limited in this regard, fin portion 530a may further comprise one or more sub-portions 534 other than any structure that is to be part of the non-planar transistor.

At stage 501, etching may be performed through patterned mask 516 to partially remove some of the sacrificial material (e.g., including SiN) of dummy gate 550 and to partially expose section 532. For example, portions 551 of dummy gate 550 may remain after such etching. The respective top sides of some or all of portions 551 and section 532 and may be chemically polished or otherwise leveled. It is noted that during stages 500 through 505 (and similarly during stages of other processing variously described herein), one or more other polishing operations may also be performed—as appropriate—to remove overgrowth or otherwise provide one or more level surfaces of structures. Such polishing may necessitate a different order in which some structures (e.g., including a patterned mask, isolation spacers, SD structure and/or the like) are formed, or may necessitate that some or all such structures be variously removed and then reformed.

At stage 502, a modified fin portion 530b may be formed from fin portion 530a by etching to remove some or all of section 532 from a region 533 which is between SD structures 540, 542 and also between interior sidewalls of portions 551. Such etching may form or otherwise expose a side 524 of fin portion 520, and may further expose surfaces 544 of SD structures 540, 542.

At stage 503, a modified fin portion 530c may be formed by selectively depositing a dielectric 536 on the exposed portion of side 524 which extends along region 533. The deposition and/or physical properties of dielectric 536 may, for example, be similar to that described herein with respect to dielectric 336. After such deposition of dielectric 536, a horizontal growth of an epitaxial channel material 537 may be started at the exposed surfaces 544 of SD structures 540, 542. For example, CVD or other such deposition processing may be performed to introduce the second III-V semiconductor material into region 533. Although some embodiments are not limited in this regard, the second III-V semiconductor material may be the same as a III-V material of one or both of SD structures 540, 542.

The epitaxial channel material 537 may continue to grow into region 533 to form a contiguous channel structure which extends between the remaining portions 551 of dummy gate 550. For example, as shown at stage 504, a modified fin portion 530d may be formed from fin portion 530d by completing the formation of a channel structure 538 from the horizontal growth of epitaxial channel material 537. Sidewall structures of portions 551 may limit or otherwise define at least in part a final shape of channel structure 538. In some embodiments, a subsequent polishing may level a top side of channel structure 538—e.g., some or all of isolation spacers 552 and/or SD structures 540, 542 are formed (or reformed) after such polishing.

As shown at stage 505, one or more gate structures of the transistor may be formed in the region from which dummy gate 550 was removed. For example, a layer of a gate dielectric 560 may be selectively deposited on the channel structure 538, and a gate electrode 562 (e.g., part of a gate stack) may be deposited on gate dielectric 560. Gate dielectric 560 may provide electrical insulation between channel structure 538 and gate electrode 562 and/or other gate structures. Formation of gate dielectric 560, isolation spacers 552 and/or gate electrode 562 may be adapted from conventional techniques.

Figure 6:
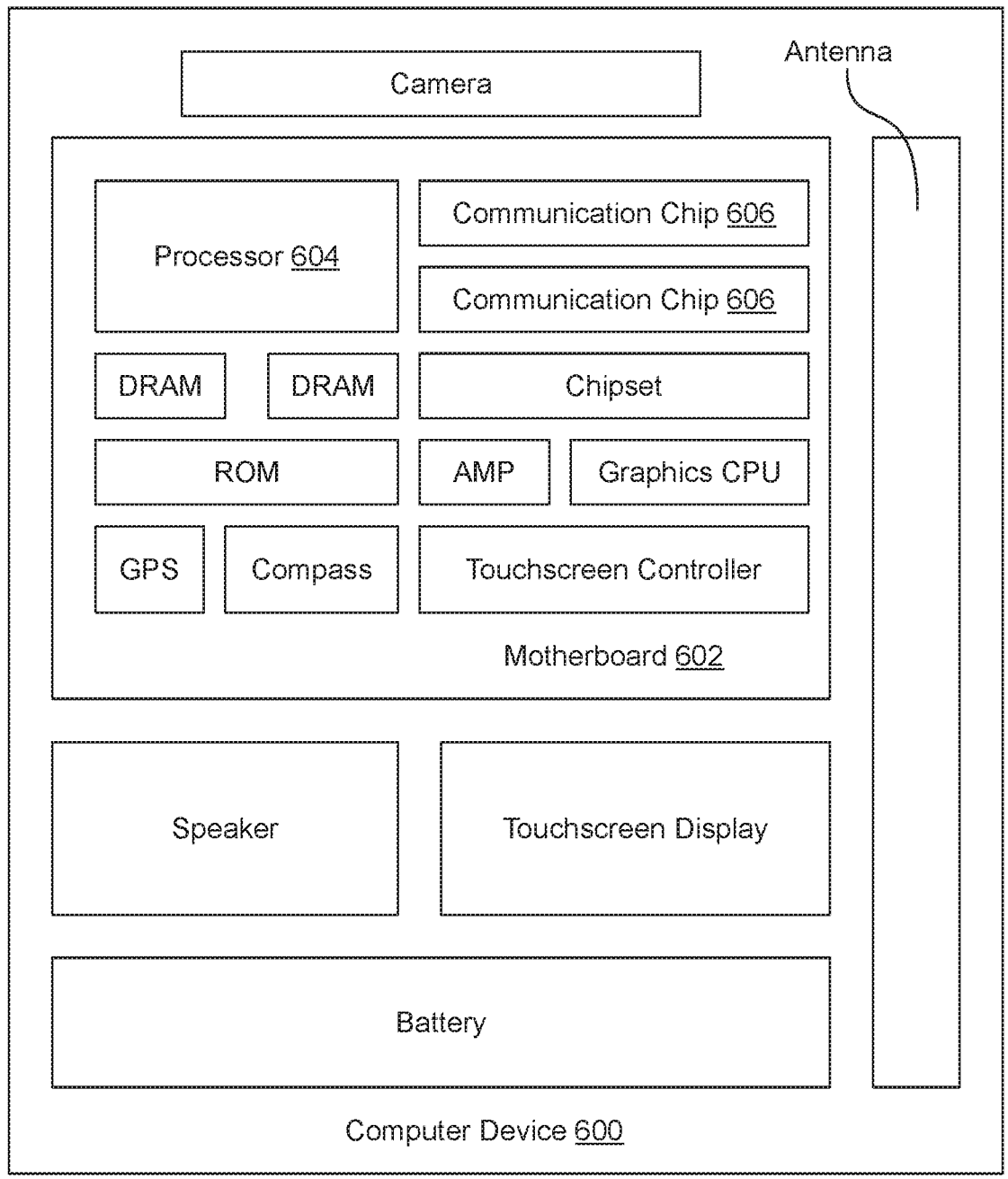
FIG. 6 is a functional block diagram illustrating a computing device in accordance with one embodiment.

FIG. 6 illustrates a computing device 600 in accordance with one embodiment. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family). IEEE 802.20, long term evolution (LTE), Ev-DO, HSPA+, HSDPA+, HSUPA+, EDGE, GSM. GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE. GPRS, CDMA, WiMAX, LTE. Ev-DO, and others.

The processor 604 of the computing device 600 includes an integrated circuit die packaged within the processor 604. The term "processor" may refer to any device or portion of a device that processes electronic data from registers and/or memory to transform that electronic data into other electronic data that may be stored in registers and/or memory. The communication chip 606 also includes an integrated circuit die packaged within the communication chip 606.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Some embodiments may be provided as a computer program product, or software, that may include a machine-readable medium having stored thereon instructions, which may be used to program a computer system (or other electronic devices) to perform a process according to an embodiment. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 7:
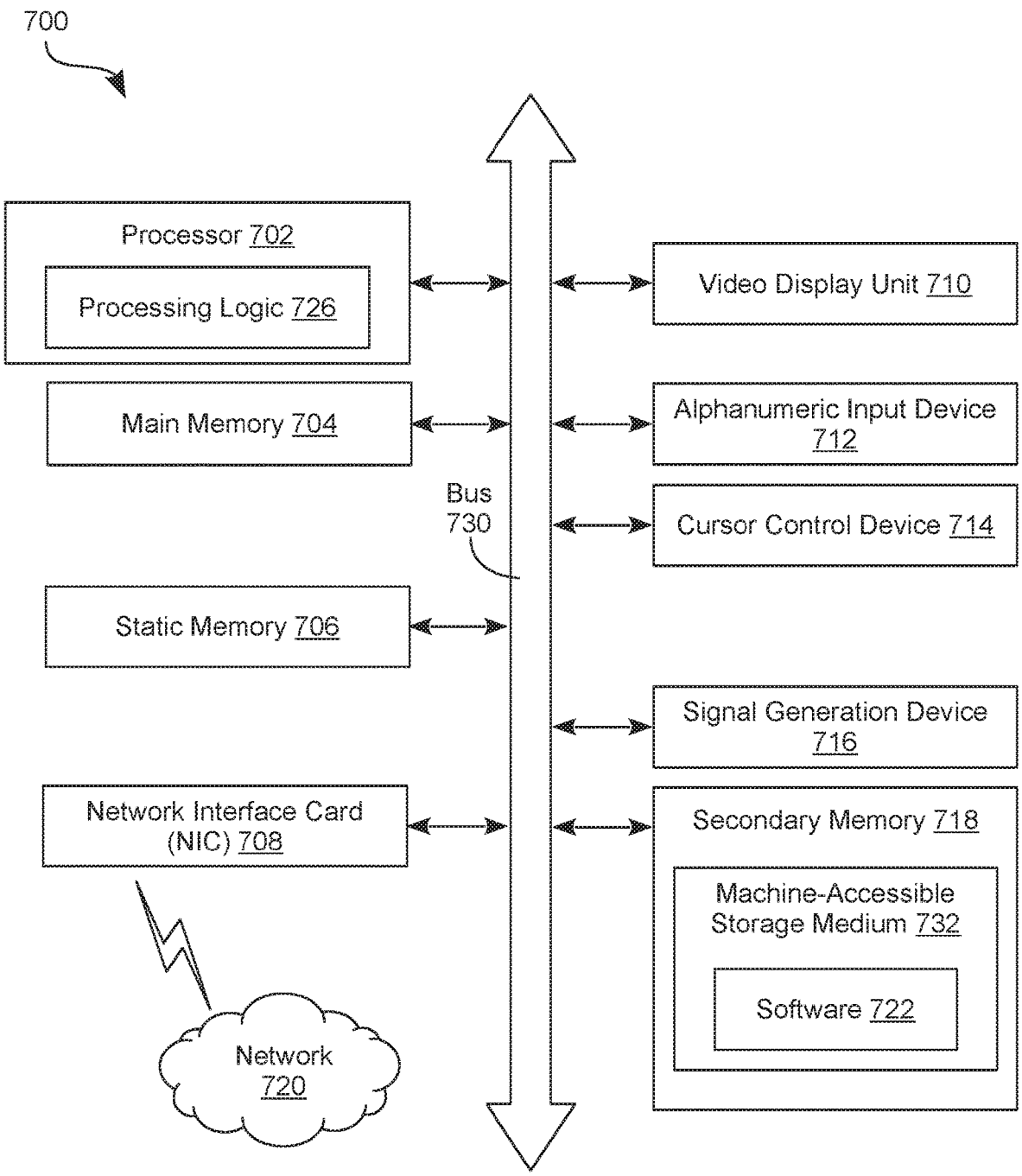
FIG. 7 is a functional block diagram illustrating an exemplary computer system, in accordance with one embodiment.

FIG. 7 illustrates a diagrammatic representation of a machine in the exemplary form of a computer system 700 within which a set of instructions, for causing the machine to perform any one or more of the methodologies described herein, may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 700 includes a processor 702, a main memory 704 (e.g., read-only memory (ROM), flash memory, dynamic random access memory (DRAM) such as synchronous DRAM (SDRAM) or Rambus DRAM (RDRAM), etc.), a static memory 706 (e.g., flash memory, static random access memory (SRAM), etc.), and a secondary memory 718 (e.g., a data storage device), which communicate with each other via a bus 730.

Processor 702 represents one or more general-purpose processing devices such as a microprocessor, central processing unit, or the like. More particularly, the processor 702 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 702 may also be one or more special-purpose processing devices such as an application specific integrated circuit (ASIC), a field programmable gate array (FPGA), a digital signal processor (DSP), network processor, or the like. Processor 702 is configured to execute the processing logic 726 for performing the operations described herein.

The computer system 700 may further include a network interface device 708. The computer system 700 also may include a video display unit 710 (e.g., a liquid crystal display (LCD), a light emitting diode display (LED), or a cathode ray tube (CRT)), an alphanumeric input device 712 (e.g., a keyboard), a cursor control device 714 (e.g., a mouse), and a signal generation device 716 (e.g., a speaker).

The secondary memory 718 may include a machine-accessible storage medium (or more specifically a computer-readable storage medium) 732 on which is stored one or more sets of instructions (e.g., software 722) embodying any one or more of the methodologies or functions described herein. The software 722 may also reside, completely or at least partially, within the main memory 704 and/or within the processor 702 during execution thereof by the computer system 700, the main memory 704 and the processor 702 also constituting machine-readable storage media. The software 722 may further be transmitted or received over a network 720 via the network interface device 708.

While the machine-accessible storage medium 732 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any of one or more embodiments. The term "machine-readable storage medium" shall accordingly be taken to include, but not be limited to, solid-state memories, and optical and magnetic media.

Example 1 is an integrated circuit (IC) device for communicating a signal, the IC device comprising a fin structure comprising a first fin portion comprising a first semiconductor material, and a second fin portion on the first fin portion, the second fin portion comprising a semiconductor body of a device, the semiconductor body comprising a second semiconductor material other than the first semiconductor material, wherein a dielectric is between, and adjoins each of, the first semiconductor material of the first fin portion and the second semiconductor material of the semiconductor body. The IC device further comprises a gate dielectric of the device, wherein the gate dielectric adjoins the semiconductor body and the dielectric, wherein a portion of the semiconductor body is between respective portions of the gate dielectric and the dielectric.

In Example 2, the subject matter of Example 1 optionally includes wherein the portion of the semiconductor body is between a source of the device and a drain of the device.

In Example 3, the subject matter of any one or more of Examples 1 and 2 optionally includes wherein the first semiconductor material includes one or more of gallium (Ga), arsenic (As), indium (In), phosphorous (P), or aluminum (Al).

In Example 4, the subject matter of any one or more of Examples 1 through 3 optionally includes wherein the first semiconductor material includes a first III-V material and wherein the second semiconductor material includes a second III-V material.

In Example 5, the subject matter of Example 4 optionally includes wherein the first semiconductor material comprises gallium (Ga) and arsenic (As).

In Example 6, the subject matter of Example 4 optionally includes wherein the first semiconductor material comprises indium (In) and phosphorus (P).

In Example 7, the subject matter of Example 4 optionally includes wherein the first semiconductor material comprises indium (In), aluminum (Al) and arsenic (As).

In Example 8, the subject matter of Example 4 optionally includes wherein the second semiconductor material comprises one or more of arsenic (As), indium (In) or gallium (Ga).

In Example 9, the subject matter of Example 8 optionally includes wherein the second semiconductor material comprises In, Ga and As.

In Example 10, the subject matter of Example 9 optionally includes wherein the second semiconductor material comprises $In_xGa_{1-x}As_y$, wherein x is a mole fraction of In and y is a mole fraction of As.

In Example 11, the subject matter of any one or more of Examples 1 through 4 optionally includes wherein the dielectric includes one or more of Si, N, O, Al, Hf, or Zr.

Example 12 is a method for fabricating an integrated circuit, the method comprising forming a first portion of a fin structure, the first portion comprising a first semiconductor material, forming on the first portion a second portion of the fin structure, forming a dummy gate which extends over the section, and etching the section away from a region over the first portion. The method further comprises depositing a dielectric under the region, forming on the dielectric a semiconductor body of a device, the semiconductor body comprising a second semiconductor material other than the first semiconductor material, and replacing the dummy gate with a gate structure of the device.

In Example 13, the subject matter of Example 12 optionally includes wherein forming the semiconductor body comprises performing a first horizontal growth of an epitaxial material including the second semiconductor material, the first horizontal growth in a first direction from a first surface of the second portion.

In Example 14, the subject matter of Example 13 optionally includes wherein forming the semiconductor body comprises performing, concurrent with the first horizontal growth, a second horizontal growth of the epitaxial material from a second surface of the second portion, the second horizontal growth in a second direction opposite the first direction.

In Example 15, the subject matter of Example 13 optionally includes wherein a first source or drain structure of the device includes the first surface.

In Example 16, the subject matter of Example 15 optionally includes the method further comprising, after forming the semiconductor body, growing a second source or drain structure of the device at an end of the semiconductor body.

In Example 17, the subject matter of any one or more of Examples 12 and 13 optionally includes wherein the portion of the semiconductor body is between a source of the device and a drain of the device.

In Example 18, the subject matter of any one or more of Examples 12, 13 and 17 optionally includes wherein the first semiconductor material includes one or more of gallium (Ga), arsenic (As), indium (In), phosphorous (P), or aluminum (Al).

In Example 19, the subject matter of any one or more of Examples 12, 13, 17 and 18 optionally includes wherein the first semiconductor material includes a first III-V material and wherein the second semiconductor material includes a second III-V material.

In Example 20, the subject matter of Example 19 optionally includes wherein the first semiconductor material comprises gallium (Ga) and arsenic (As).

In Example 21, the subject matter of Example 19 optionally includes wherein the first semiconductor material comprises indium (In) and phosphorus (P).

In Example 22, the subject matter of Example 19 optionally includes wherein the first semiconductor material comprises indium (In), aluminum (Al) and arsenic (As).

In Example 23, the subject matter of Example 19 optionally includes wherein the second semiconductor material comprises one or more of arsenic (As), indium (In) or gallium (Ga).

In Example 24, the subject matter of Example 23 optionally includes wherein the second semiconductor material comprises In, Ga and As.

In Example 25, the subject matter of Example 24 optionally includes wherein the second semiconductor material comprises $In_xGa_{1-x}As_y$, wherein x is a mole fraction of In and y is a mole fraction of As.

In Example 26, the subject matter of any one or more of Examples 12, 13 and 17 through 19 optionally includes wherein the dielectric includes one or more of Si, N, O, Al, Hf, or Zr.

Example 27 is a system comprising an integrated circuit (IC) device for communicating a signal, the IC device comprising a fin structure comprising a first fin portion comprising a first semiconductor material, and a second fin portion on the first fin portion, the second fin portion comprising a semiconductor body of a device, the semiconductor body comprising a second semiconductor material other than the first semiconductor material, wherein a dielectric is between, and adjoins each of, the first semiconductor material of the first fin portion and the second semiconductor material of the semiconductor body. The IC device further comprises a gate dielectric of the device, wherein the gate dielectric adjoins the semiconductor body and the dielectric, wherein a portion of the semiconductor body is between respective portions of the gate dielectric and the dielectric. The system further comprises a display device coupled to the IC device, the display device to display an image based on a signal communicated with the device.

In Example 28, the subject matter of Example 27 optionally includes wherein the portion of the semiconductor body is between a source of the device and a drain of the device.

In Example 29, the subject matter of any one or more of Examples 27 and 28 optionally includes wherein the first semiconductor material includes one or more of gallium (Ga), arsenic (As), indium (In), phosphorous (P), or aluminum (Al).

In Example 30, the subject matter of any one or more of Examples 27 through 29 optionally includes wherein the first semiconductor material includes a first III-V material and wherein the second semiconductor material includes a second III-V material.

In Example 31, the subject matter of Example 30 optionally includes wherein the first semiconductor material comprises gallium (Ga) and arsenic (As).

In Example 32, the subject matter of Example 30 optionally includes wherein the first semiconductor material comprises indium (In) and phosphorus (P).

In Example 33, the subject matter of Example 30 optionally includes wherein the first semiconductor material comprises indium (In), aluminum (Al) and arsenic (As).

In Example 34, the subject matter of Example 30 optionally includes wherein the second semiconductor material comprises one or more of arsenic (As), indium (In) or gallium (Ga).

In Example 35, the subject matter of Example 34 optionally includes wherein the second semiconductor material comprises In, Ga and As.

In Example 36, the subject matter of Example 35 optionally includes wherein the second semiconductor material comprises $In_xGa_{1-x}As_y$, wherein x is a mole fraction of In and y is a mole fraction of As.

In Example 37, the subject matter of any one or more of Examples 27 through 29 optionally includes wherein the dielectric includes one or more of Si, N, O, Al, Hf, or Zr.

Techniques and architectures for providing functionality of a non-planar transistor are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. An integrated circuit (IC) device for communicating a signal, the IC device comprising:
    a fin structure comprising:
        a first fin portion comprising a first semiconductor material; and
        a second fin portion on the first fin portion, the second fin portion comprising:
            a first sub-portion and a second sub-portion which each adjoin the first fin portion, wherein the first sub-portion and the second sub-portion comprise a second semiconductor material;
        a semiconductor body of a device, the semiconductor body in a region which extends between the first sub-portion and the second sub-portion, the semiconductor body comprising a third semiconductor material other than the first semiconductor material; and
        a dielectric in the region which extends between the first sub-portion and the second sub-portion, wherein the dielectric is between, and adjoins each of, the first semiconductor material of the first fin portion and the third semiconductor material of the semiconductor body; and
    a gate dielectric of the device, wherein the gate dielectric adjoins the semiconductor body and the dielectric, wherein a portion of the semiconductor body is between respective portions of the gate dielectric and the dielectric.

2. The IC device of claim 1, wherein the dielectric, and the portion of the semiconductor body are each between a source of the device and a drain of the device.

3. The IC device of claim 1, wherein the first semiconductor material includes one or more of: gallium (Ga), arsenic (As), indium (In), phosphorous (P), or aluminum (Al).

4. The IC device of claim 1, wherein the first semiconductor material includes a first III-V material and wherein the third semiconductor material includes a second III-V material.

5. The IC device of claim 4, wherein the first semiconductor material comprises gallium (Ga) and arsenic (As).

6. The IC device of claim 4, wherein the first semiconductor material comprises indium (In) and phosphorus (P).

7. The IC device of claim 4, wherein the first semiconductor material comprises indium (In), aluminum (Al) and arsenic (As).

8. The IC device of claim 4, wherein the third semiconductor material comprises one or more of arsenic (As), indium (In) or gallium (Ga).

9. The IC device of claim 8, wherein the third semiconductor material comprises In, Ga and As.

10. The IC device of claim 9, wherein the third semiconductor material comprises $In_xGa_{1-x}As_y$, wherein x is a mole fraction of In and y is a mole fraction of As.

11. The IC device of claim 1, wherein the dielectric includes one or more of Si, N, O, Al, Hf, or Zr.

12. A method for fabricating an integrated circuit, the method comprising:
    forming a first portion of a fin structure, the first portion comprising a first semiconductor material;
    forming on the first portion a second portion of the fin structure;
    forming a dummy gate which extends over a section of the second portion;
    etching the section away from a region over the first portion;
    depositing a dielectric under the region;
    forming on the dielectric a semiconductor body of a device, the semiconductor body comprising a second semiconductor material other than the first semiconductor material, wherein forming the semiconductor body comprises performing a first horizontal growth of an epitaxial material including the second semiconductor material, the first horizontal growth in a first direction from a first surface of the second portion; and
    replacing the dummy gate with a gate structure of the device.

13. The method of claim 12, wherein forming the semiconductor body comprises performing, concurrent with the first horizontal growth, a second horizontal growth of the epitaxial material from a second surface of the second portion, the second horizontal growth in a second direction opposite the first direction.

14. The method of claim 12, wherein a first source or drain structure of the device includes the first surface.

15. The method of claim 14, further comprising:
    after forming the semiconductor body, growing a second source or drain structure of the device at an end of the semiconductor body.

16. The method of claim 12, wherein the portion of the semiconductor body is between a source of the device and a drain of the device.

17. The method of claim 12, wherein the first semiconductor material includes one or more of: gallium (Ga), arsenic (As), indium (In), phosphorous (P), or aluminum (Al).

18. The method of claim 12, wherein the first semiconductor material includes a first III-V material and wherein the second semiconductor material includes a second III-V material.

19. The method of claim 12, wherein the dielectric includes one or more of Si, N, O, Al, Hf, or Zr.

20. A system comprising:
an integrated circuit (IC) device for communicating a signal, the IC device comprising:
a fin structure comprising:
a first fin portion comprising a first semiconductor material; and
a second fin portion on the first fin portion, the second fin portion comprising:
a first sub-portion and a second sub-portion which each adjoin the first fin portion, wherein the first sub-portion and the second sub-portion comprise a second semiconductor material;
a semiconductor body of a device, the semiconductor body in a region which extends between the first sub-portion and the second sub-portion, the semiconductor body comprising a third semiconductor material other than the first semiconductor material; and
a dielectric in the region which extends between the first sub-portion and the second sub-portion, wherein the dielectric is between, and adjoins each of, the first semiconductor material of the first fin portion and the third semiconductor material of the semiconductor body; and
a gate dielectric of the device, wherein the gate dielectric adjoins the semiconductor body and the dielectric, wherein a portion of the semiconductor body is between respective portions of the gate dielectric and the dielectric; and
a display device coupled to the IC device, the display device to display an image based on a signal communicated with the device.

21. The system of claim 20, wherein the dielectric, and the portion of the semiconductor body are each between a source of the device and a drain of the device.

22. The system of claim 20, wherein the first semiconductor material includes one or more of: gallium (Ga), arsenic (As), indium (In), phosphorous (P), or aluminum (Al).

23. The system of claim 20, wherein the first semiconductor material includes a first III-V material and wherein the third semiconductor material includes a second III-V material.

24. The system of claim 20, wherein the dielectric includes one or more of Si, N, O, Al, Hf, or Zr.

* * * * *